(12) United States Patent
Wellenstein et al.

(10) Patent No.: US 8,922,193 B2
(45) Date of Patent: Dec. 30, 2014

(54) CURRENT METER

(71) Applicant: Brandeis University, Waltham, MA (US)

(72) Inventors: Hermann F. Wellenstein, Waltham, MA (US); Paul Keselman, Berkeley, CA (US)

(73) Assignee: Brandeis University, Waltham, MA (US)

( * ) Notice: Subject to any disclaimer, the term of this patent is extended or adjusted under 35 U.S.C. 154(b) by 206 days.

(21) Appl. No.: 13/693,274

(22) Filed: Dec. 4, 2012

(65) Prior Publication Data

US 2013/0141077 A1     Jun. 6, 2013

Related U.S. Application Data

(60) Provisional application No. 61/566,825, filed on Dec. 5, 2011.

(51) Int. Cl.
*G01R 23/02*     (2006.01)
*G01R 19/00*     (2006.01)
*G01R 15/14*     (2006.01)

(52) U.S. Cl.
CPC ............ *G01R 19/0092* (2013.01); *G01R 23/02* (2013.01); *G01R 15/148* (2013.01)
USPC ................................... 324/76.39; 324/76.11

(58) Field of Classification Search
CPC .... G01R 19/0092; G01R 23/00; G01R 23/02; G01R 23/09
USPC ............ 324/76.39, 76.11, 539, 103 R, 103 P, 324/110, 127, 96, 522, 713; 336/173, 225; 361/659, 661, 664, 666, 668; 702/38, 702/64
See application file for complete search history.

(56) References Cited

U.S. PATENT DOCUMENTS

| | | | | |
|---|---|---|---|---|
| 4,080,570 | A | * | 3/1978 | Pearson ........................ 324/156 |
| 5,594,332 | A | * | 1/1997 | Harman et al. ............... 324/127 |
| 6,555,999 | B1 | * | 4/2003 | Lindsey et al. ............ 324/76.11 |

OTHER PUBLICATIONS

Megger, "MMC850 Multi-core AC digital clamp meter" downloaded Nov. 30, 2012.

* cited by examiner

*Primary Examiner* — Hoai-An D Nguyen
(74) *Attorney, Agent, or Firm* — BainwoodHuang

(57) ABSTRACT

Apparatus, usable to measure current in a multiple-conductor cable having supply and return conductors spaced apart by a nominal conductor spacing and carrying respective supply and return currents in opposite directions, includes (1) a non-magnetic body having a cable-engaging portion defining a location and an orientation axis of the multiple-conductor cable relative to the apparatus when the cable-engaging portion engages the cable during use, (2) a planar, multi-turn wire coil supported by the body immediately adjacent to the location and lying in a plane parallel to the orientation axis, the wire coil having a coil diameter at least four times the nominal conductor spacing, and (3) signal conditioning circuitry operative in response to a voltage signal developed across output ends of the wire coil to generate a conditioned voltage signal having a voltage magnitude determined by and indicative of a magnitude of the supply current during use.

24 Claims, 24 Drawing Sheets

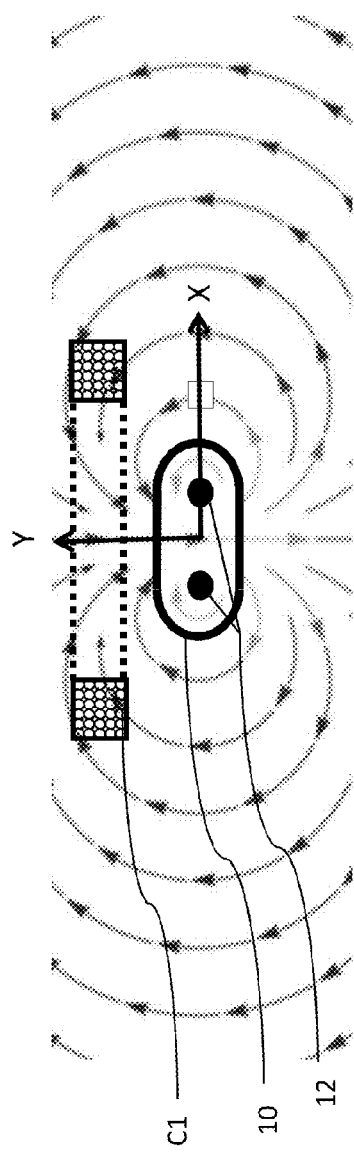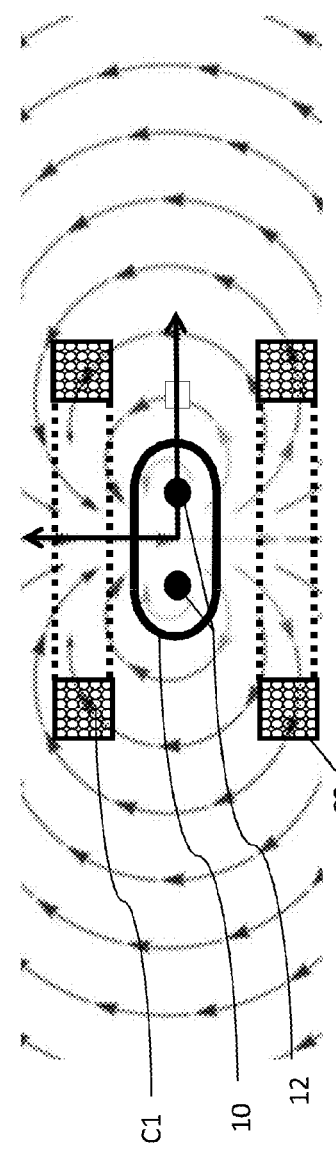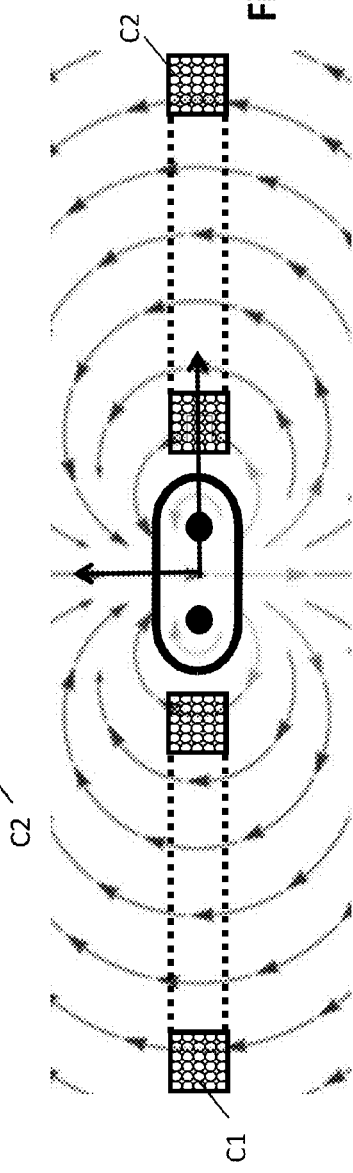

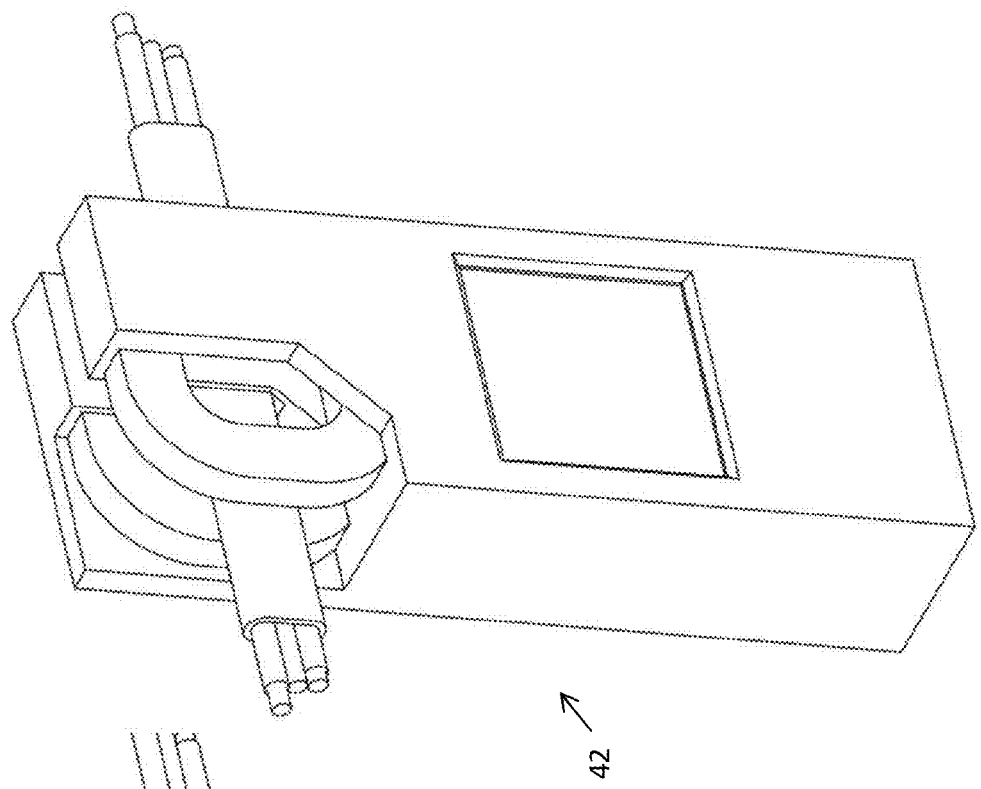
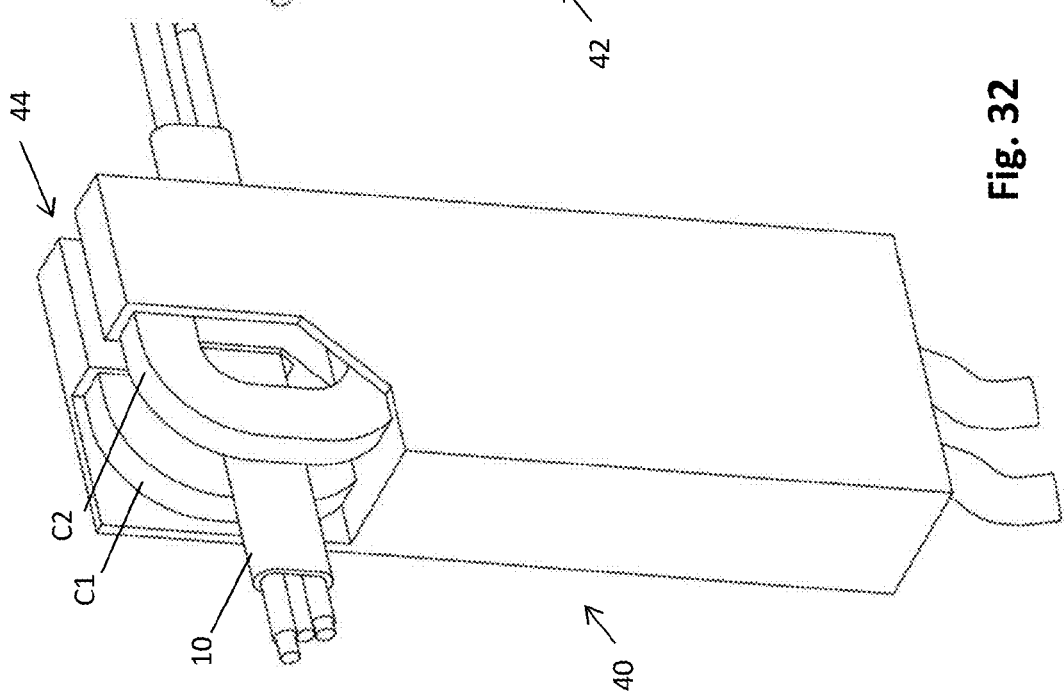
Fig. 32
Fig. 33

CURRENT METER

BACKGROUND

In electrical and electronic engineering, a device to measure current through a conductor is a clamp or current-probe with two jaws, which open and clamp around a wire. This allows the electrical current in the conductor to be measured without having to make physical contact with it, or having to disconnect it for insertion through the probe. An electrical meter with an integral current clamp is known as a clamp meter, clamp-on ammeter, or tong tester. Several types exist:

1. Rectifiers: Less-expensive clamp meters use a rectifier circuit which actually reads mean current, but are calibrated to display the RMS current corresponding to the measured mean, only giving a correct RMS reading if the current is a sine wave. The readings produced by such meters can be quite inaccurate. Meters, which respond to true RMS rather than mean-current, are called "true RMS" meters.
2. Split Ferrite Ring: A common form of clamp meter uses a split ferrite ring. A wire coil is wound around one or both halves, forming the secondary winding of a current transformer, where the conductor to be measured acts like the primary winding. Like any transformer this type only works with AC or pulse waveforms, with some instruments extending into the megahertz range.
3. Iron Vane: In the iron vane type, the magnetic flux in the conductor directly affects a moving iron vane, allowing both AC and DC to be measured and gives a true RMS value for non-sinusoidal AC waveforms. Due to its physical size it is generally limited to power transmission frequencies up to around 100 Hz. The vane is usually fixed directly to the display mechanism of an analogue (moving pointer) clamp meter. The iron jaws of the meter direct the magnetic field surrounding the conductor to an iron vane that is attached to the needle of the meter. The iron vane moves in proportion to the strength of the magnetic field and thus produces a meter indication proportional to the current.
4. Hall-Effect: The Hall-Effect type is more sensitive and is able to measure both DC and AC; some instruments measure up to the kilohertz range. This type is often used with oscilloscopes and with high-end computerized digital multi-meters. Typical handheld Hall Effect units can read currents of 200 mA and even lower.
5. Open Jaw: Hall Effect probes can also be of the "open jaw" design. Their advantage is the ease to measure AC current without having to open the jaws, making this mechanical part unnecessary. Test-leads are often added to use this instrument as a regular multi-function meter.

The above known meters have certain shortcomings. Conventional current-clamp meters can only measure current in a single-conductor cable, requiring the conductors of multi conductor cables to be separated before the current in one conductor can be measured. It is against the electrical installation code of residential and industrial wiring to open cables or to separate wires. If more than one conductor were to be passed through, the measurement would be the vector sum of the currents flowing in the conductors. If the clamp is closed around a two-conductor cable in which the same current flows down one conductor and up the other, the conventional meter will provide a reading of zero.

SUMMARY

The presently disclosed technique takes advantage of the magnetic field pattern surrounding a multiple-conductor cable to provide acceptably accurate current readings of AC current using simple and inexpensive components (e.g., coils and capacitors). More specifically, a current meter is disclosed that (1) has only a small number (e.g., one or two) coils, (2) uses a large number of turns in each coil to obtain a robust signal output, and (3) can have a coil geometry and placement that may be optimized with respect to certain parameters. Generally, and optimal arrangement is achieved when an output signal is strong and accurately proportional to the electric current in the cable, while also being insensitive to small displacements between the cable and meter.

In one general respect, the above goals may be achieved if, for example, a coil having a large size with respect to the cable conductor spacing is placed close to the cable in an area of low divergence of the magnetic field. In this case, the coil extends across a large area of high magnetic flux and therefore produces a large output voltage signal. At the same time, this signal is not very sensitive to displacements of the cable with respect to the coil, as only the perpendicular components of the B-field induce a signal. Generally, coil diameter is at least four times the nominal conductor spacing of the cable. In one embodiment, a second coil may be used to obtain both a stronger output signal as well as a differential effect further reducing sensitivity to displacement.

BRIEF DESCRIPTION OF THE DRAWINGS

The foregoing and other objects, features and advantages will be apparent from the following description of particular embodiments of the invention, as illustrated in the accompanying drawings in which like reference characters refer to the same parts throughout the different views. The drawings are not necessarily to scale, emphasis instead being placed upon illustrating the principles of various embodiments of the invention.

FIGS. 1-3 are schematic diagrams illustrating coil placement adjacent to a current carrying, multiple-conductor cable;

FIGS. 32-33 are perspective views of a current probe and a current meter respectively;

DETAILED DESCRIPTION

Figure 4:
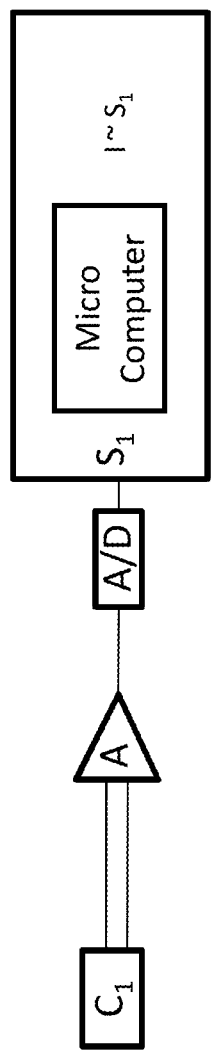
FIGS. 4 and 5 are schematic diagrams of electronic circuitry of a current meter.

FIGS. 1-3 illustrate three different configurations of placement of coils C1, C2 for sensing current carried by a two-conductor electrical cable 10, including a depiction of a magnetic field pattern surrounding the cable 10. The view is a schematic cross-sectional view in which the elongated conductors (wires) 12 extend perpendicular to the plane of the drawing. The two in-plane orthogonal directions are labeled X and Y as shown in FIG. 1. The pattern of the magnetic field does not change in the direction of the current carrying conductors 12. The scale parameter for this drawing is "d", the separation between the two conductors 12 in these figures. The cross section of the multi-turn coils C1, C2 is shown in positions adjacent to the cable 10. As described more below, the shape of the coils C1, C2 may be circular, oval or rectangular for example. Generally, increasing the width of coils C1, C2 in the direction perpendicular to the drawing (direction of current) will increase the magnetic flux cutting through the coils C1, C2 in a linear manner.

In the present description the cable 10 is generally a plastic-sheathed cable of the type commonly referred to as Non-Metallic or "NM" building wire, also known by the trademark ROMEX® of the Southwire Corporation. FIG. 1 depicts a two-wire variant of NM cable that has a flattened oval cross-sectional shape and two current-carrying conductors 12, one of which is typically a supply conductor carrying an AC supply current in one direction and the other of which is typically a return conductor carrying an AC return current in the other direction. In most cases of proper wiring the supply and return currents are equal in magnitude, resulting in the magnetic field as shown. The presently disclosed techniques are applicable to other cable configurations including round sheathed cables and even to sets of individual conductors running inside plastic or other non-magnetic conduits. As described below, a current meter can provide an accurate reading of current magnitude when the locations of the coil(s) C1, C2 relative to the conductors are is well known. When the conductors are not in a well-defined position, as may be the case for round cables or conductors running in conduits, the meter may be more useful as a qualitative instrument that indicates the presence of current but does not necessarily provide an accurate reading of current magnitude.

Figure 5:
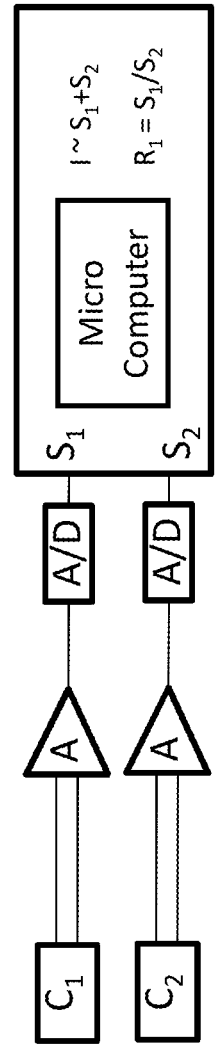
Figure 7:
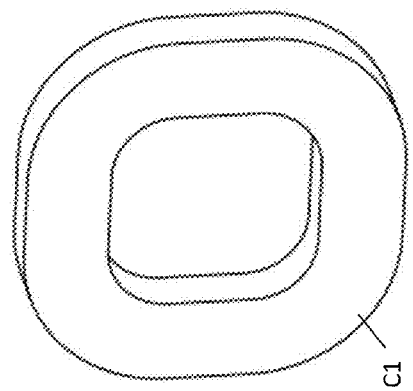
FIGS. 6-11 are schematic depictions of current sensing coils.
Figure 8:
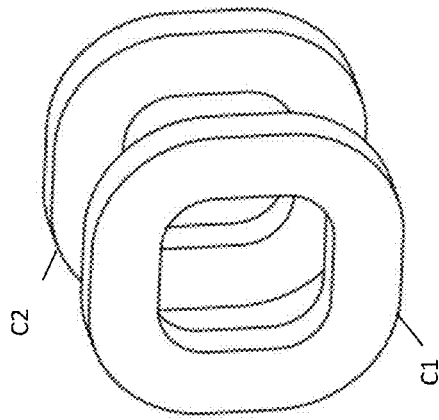

FIGS. 4-5 show electronic circuitry constituting a read-out system for each of the configurations of FIGS. 1-3. The output of each coil may be shunted with a capacitor (not shown), which, together with the coil resistance acts as a low pass filter. Using an active filter is an alternative possibility. The filtered AC voltage signal is amplified by amplifier A, digitized by analog/digital converter A/D, and then applied to computation circuitry such as a micro-computer that applies appropriate mathematical operations, such as calculating a sum and/or ratio of RMS values of the signal(s) S1, S2 from the coils C1, C2. The circuit of FIG. 4 is usable with a single-coil arrangement such as that of FIG. 1, and the current I in the cable 10 is directly proportional to the signal S1, i.e., I=constant×S1. The circuit of FIG. 5 is usable with a double-coil arrangement such as those of FIGS. 2 and 3, and the current I in the cable 10 is directly proportional to the sum of two signals, S1+S2, i.e. I=constant×(S1+S2). The ratio of the signals in a double-coil arrangement can be used to detect possible interference of nearby cables, as described more below.

FIGS. 6-11 show different configurations of the coils C1, C2 that may be used—rectangular, circular and rounded-corner rectangular. In practice, the circular and rounded-corner configurations of FIGS. 7-8 and 10-11 are mostly likely to be used. The rectangular configuration may be useful for modeling purposes, and was used for generating the data provided herein. The dimensions may vary based on the exact application as well as other considerations. In one example, the coils have the following dimensions: an outside width or diameter D of 35 mm; a coil thickness t of 6 mm; and a depth b of 5 mm. The coils C1, C2 may be wound with fine-gauge (e.g., 44-gauge) wire and a large number of turns (generally greater than 1,000 turns, for example 10,000 turns). In one embodiment each coil has a resistance of 54 k$\Omega$ and an inductance of 3.1 H.

The single-coil configuration of FIG. 1 is a simple and robust implementation, and it is referred to as the One-Coil device herein. The cable 10 is placed very close to the coil C1, for example to within 1 to 1.5 mm (corresponding to a thickness of a plastic housing such as described below), so that the distance from cable center to coil is about 4 mm. In this configuration the voltage induced in the coil C1 is about 15 mV AC for 1 Amp of current in the cable 10. The RMS signal, S1, from coil C1 can be scaled to provide an accurate indication of current magnitude, i.e., I=constant×S1.

Figure 12:
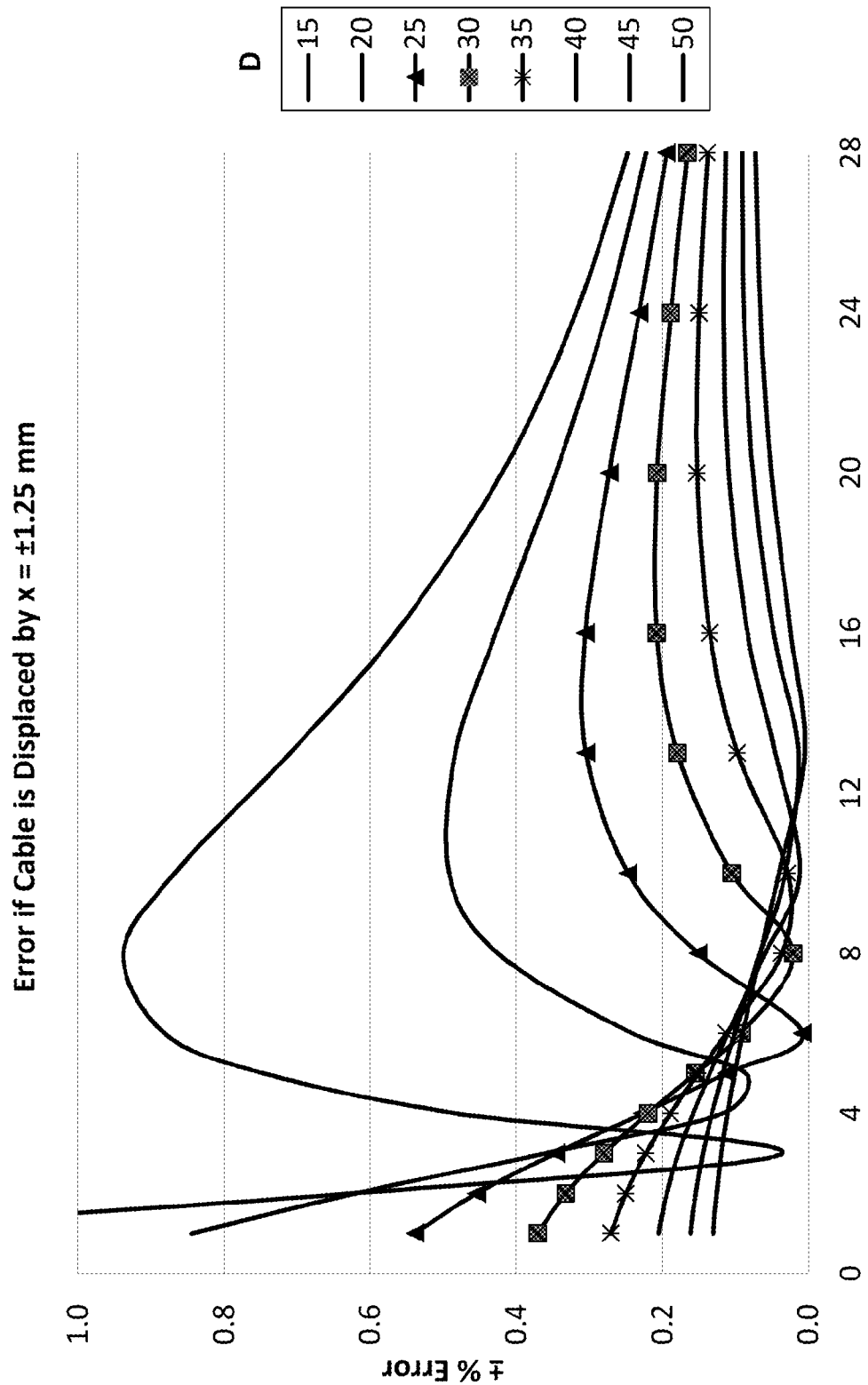
FIGS. 12-14 are plots of error in coil output versus displacement in cable position.

FIG. 12 shows the effect of diameter D and the Y-position of a square, single-loop coil C1 on the % error due to an X-displacement of ±1.25 mm. As shown, the error gets smaller as the loop becomes larger and is placed closer to the cable 10. Also shown are "sweet spots" for large-D coils where the error becomes essentially zero.

Figure 13:
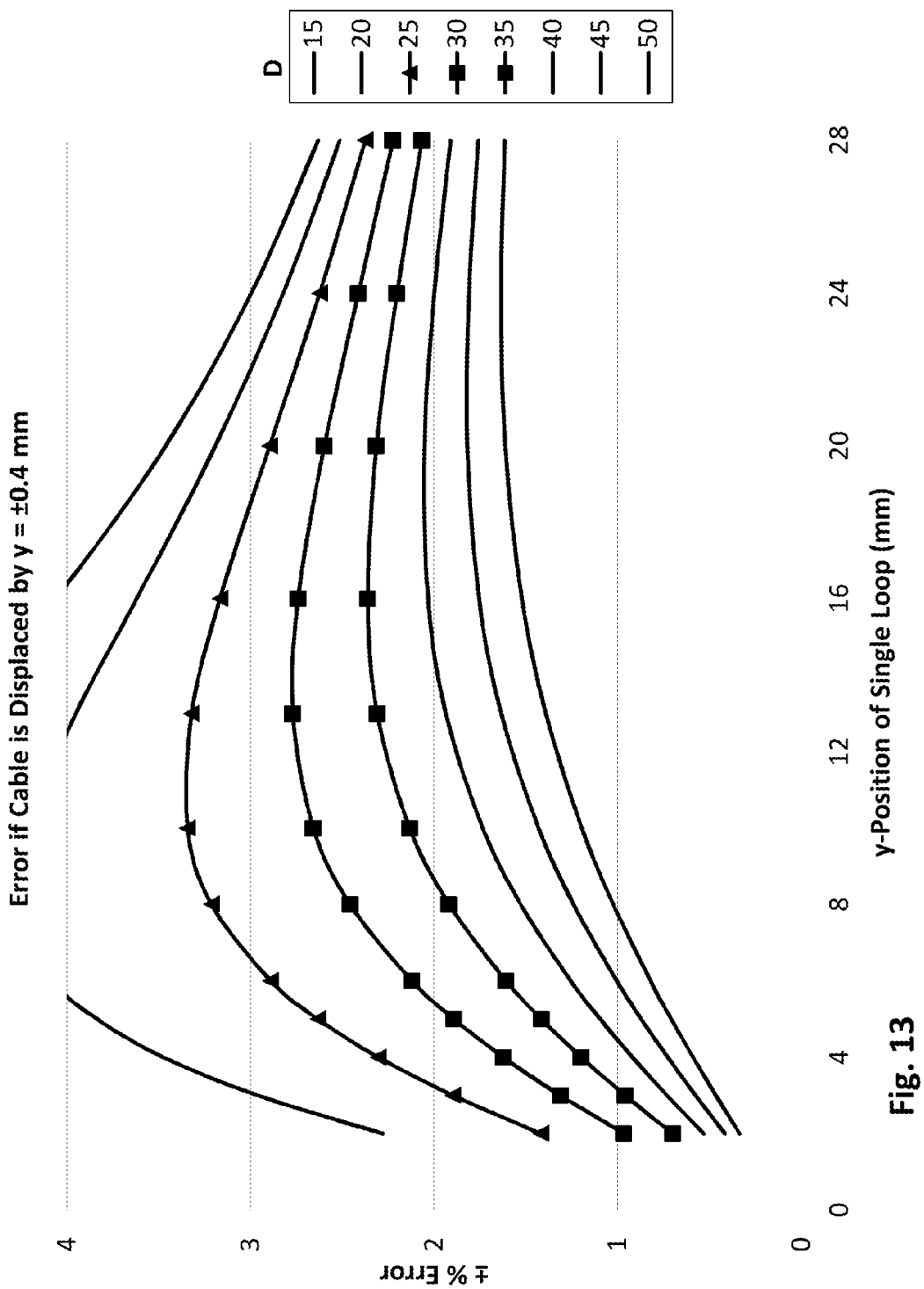

FIG. 13 shows the effect of diameter D and the Y-position of a square, single-loop coil on the % error due to a Y-displacement of ±0.4 mm. As shown, the error gets smaller as the loop becomes larger and is placed closer to the cable 10.

Figure 6:
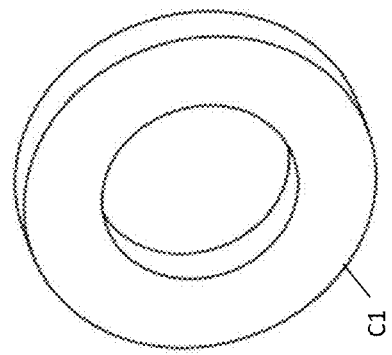
Figure 9:
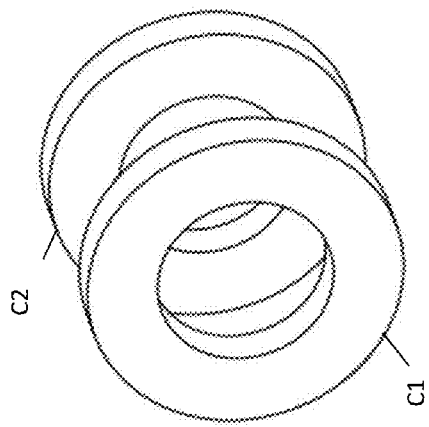
Figure 10:
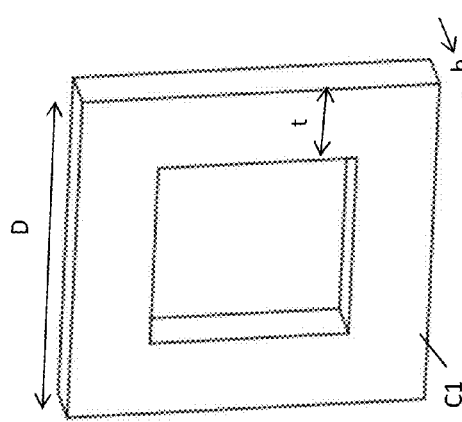
Figure 11:
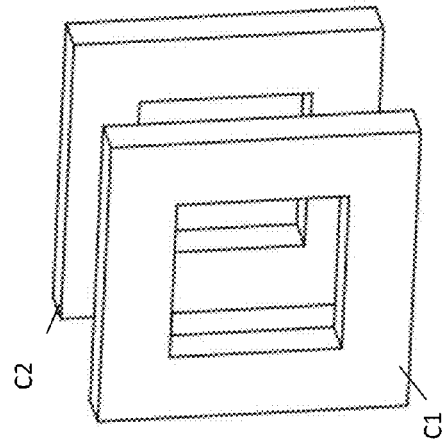
Figure 14:
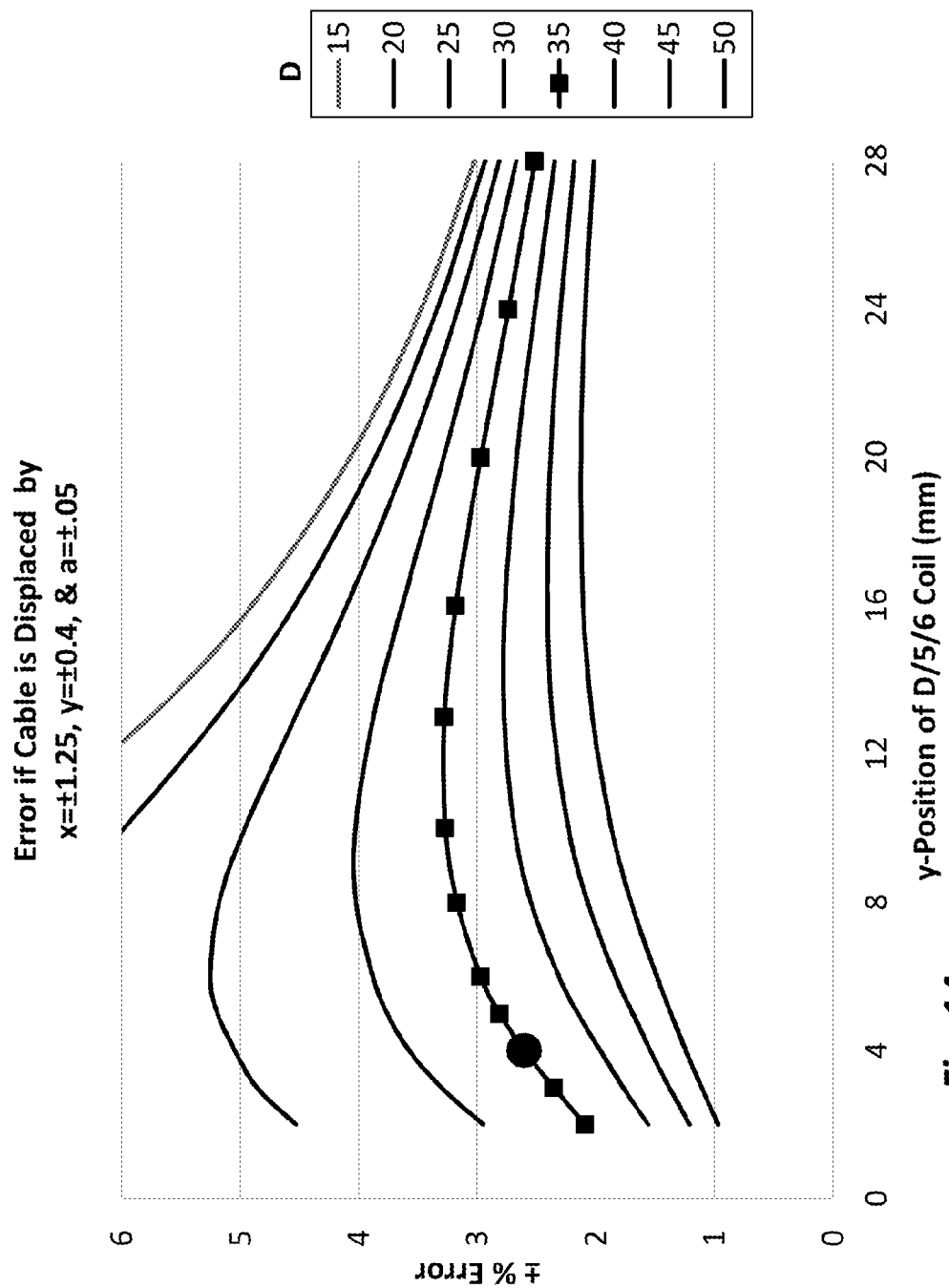

FIG. 14 shows results for a square, multi-loop coil of 6 mm thickness and 5 mm depth shown in FIG. 6. It shows the effect of diameter D and Y-position of this coil on the error due to an X-displacement of ±1.25 mm, a Y-displacement of ±0.4 mm, and a rotation of ±0.05 radians. As shown, the error gets smaller as the coil becomes larger and is placed closer to the cable 10. With y=4 mm being a practical limit of closeness and considering the cost and space needed for very large coils, the D=35 mm, b=5 mm and t=6 mm coil of FIG. 6 is a good compromise which will give an error of ±2.6%.

Figure 15:
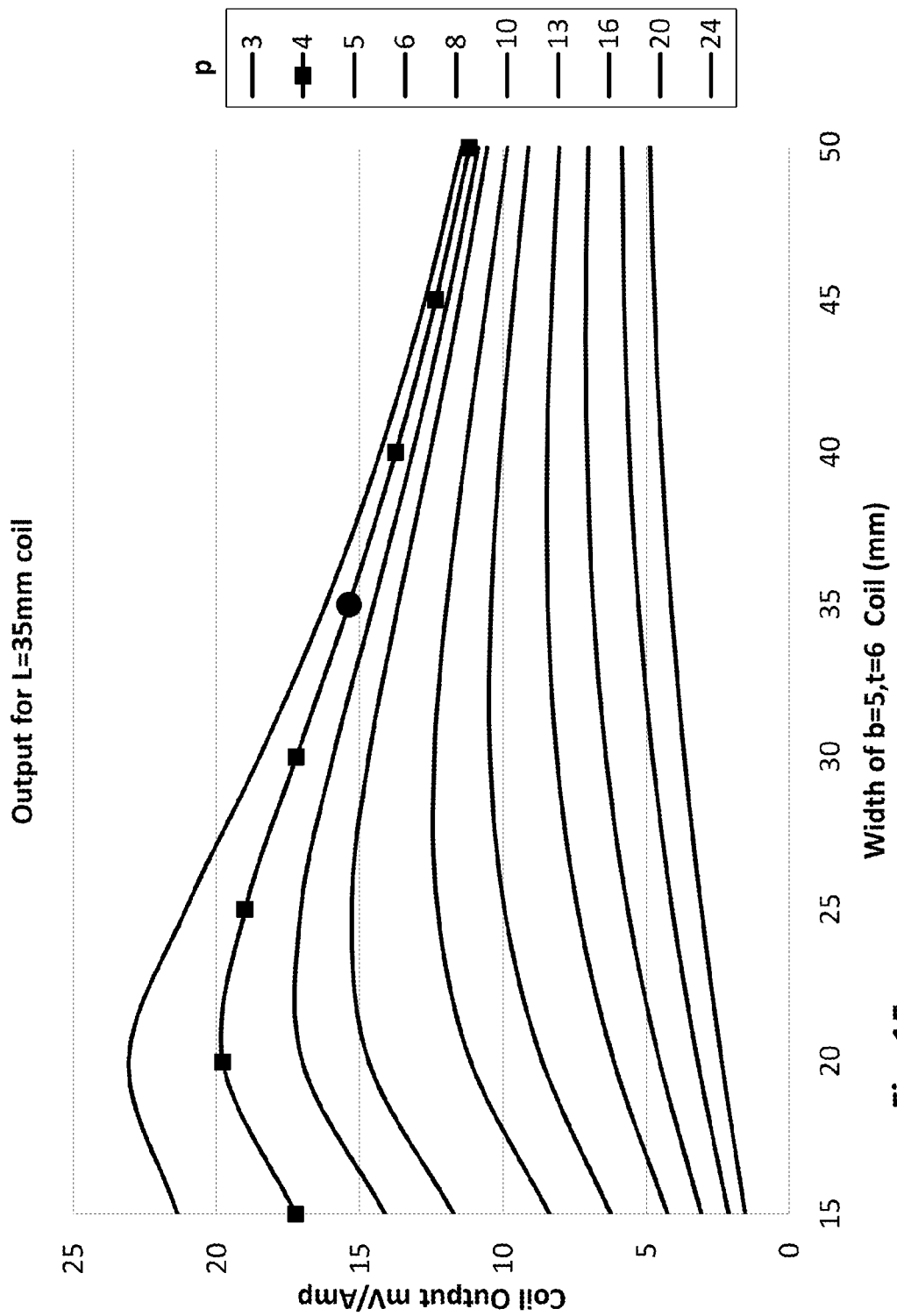
FIG. 15 is a plot of coil output versus coil width and distance to cable.
Figure 16:
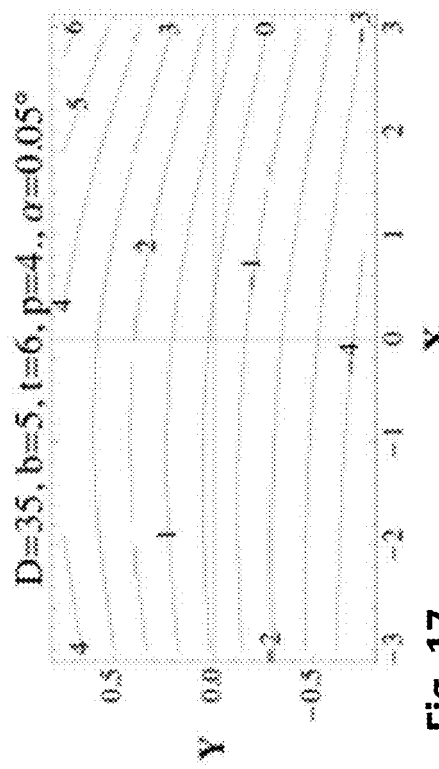
FIGS. 16-19 are plots of variation in coil output versus displacement in cable position.
Figure 17:
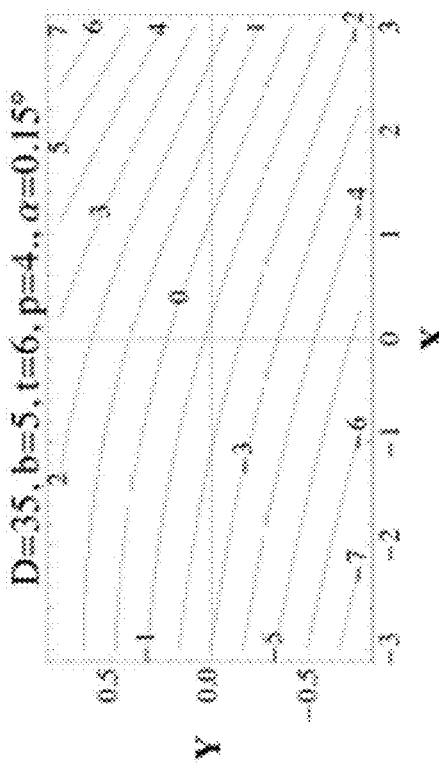
Figure 18:
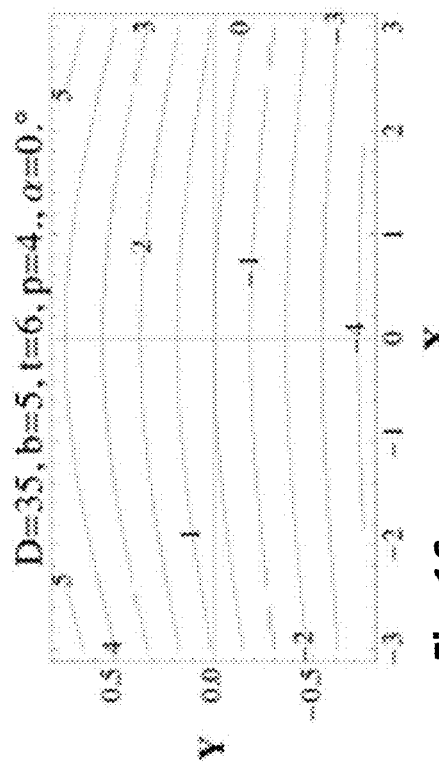
Figure 19:
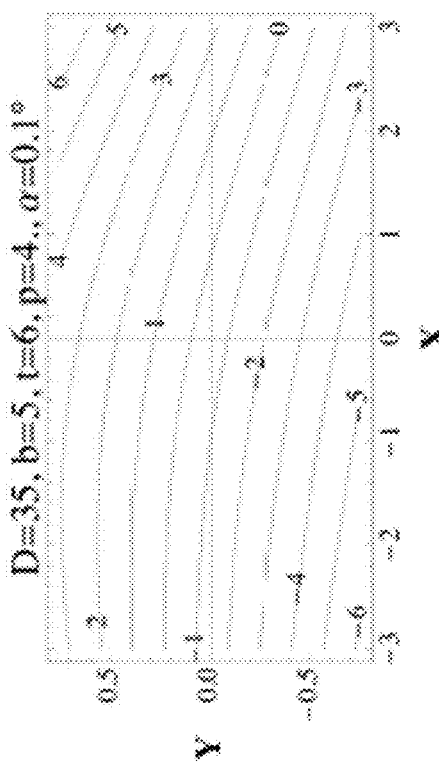

FIG. 15 shows the output signal of a rectangular, L×D coil, where L is the coil-dimension along the cable 10 and D is the dimension across the cable 10. The output is given per ampere of current in the cable 10 and is shown as a function of outside diameter D and y-position p of a multi-loop coil of 6 mm thickness and 5 mm depth, as shown in FIG. 6. In this case, p is the distance from the center of the cable 10 to the nearest part of the coil C1. The signal is proportional to L, which in the present description is equal to 35 mm for all coils. The signal increases with proximity to the cable 10, with p=4 mm being a practical limit of closeness. For each coil position, p, the maximum signal occurs at a different value of coil-width, D, where this value increases as the coil moves away from the cable. As can be appreciated with reference to FIG. 1, the flux through a coil C1 increases with D until the coil windings reach the point where the magnetic field lines become horizontal, and any further increase in coil size will reduce the signal because the field has reversed its direction. The maximum signal at p=4 mm is obtained at about D=20 mm. However, considering the increase in error as shown in FIG. 15, and the advantage of using square or round coils, the dimensions D=35 mm, t=6 mm and b=5 mm may be a good compromise, resulting in a signal of about 15 mV per Ampere in the cable 10.

FIGS. 16-19 show the percentage change, i.e. error, in induced voltage if the cable 10 is displaced by ±3 mm in X, ±0.75 mm in Y for angles of rotation of 0, 0.05, 0.1, and 0.15 radians respectively. The maximum error is 5.5% over most of this this domain.

FIGS. 12-14 and 16-19 show the percentage variation of the signal as measured by coil, C1, if the cable 10 is moved in X and Y with different angles of rotation, α. It is easy to constrain the cable 10 horizontally to ±1.25 mm, vertically to ±0.4 mm and rotationally to ±0.05 Radians (i.e. ±2.5°), and therefore the error due to cable displacement can be limited to less than 2%. This error is not large when compared to the error due to the variation of wire separation, d, and voltage variation. FIGS. 16-19 show that a larger set of cables, e.g., 10±2 mm wide and 5±1 mm thick, can easily be accommodated and the error will still be kept under 5%. Other coil geometries and positions are possible.

Figure 21:
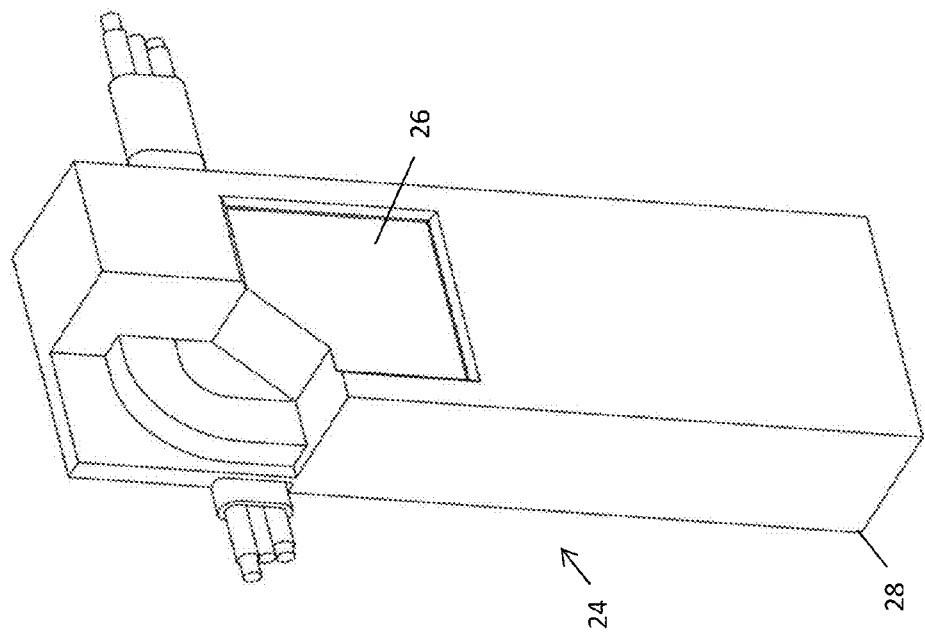
FIGS. 20-21 are perspective views of a current probe and a current meter respectively.
Figure 20:
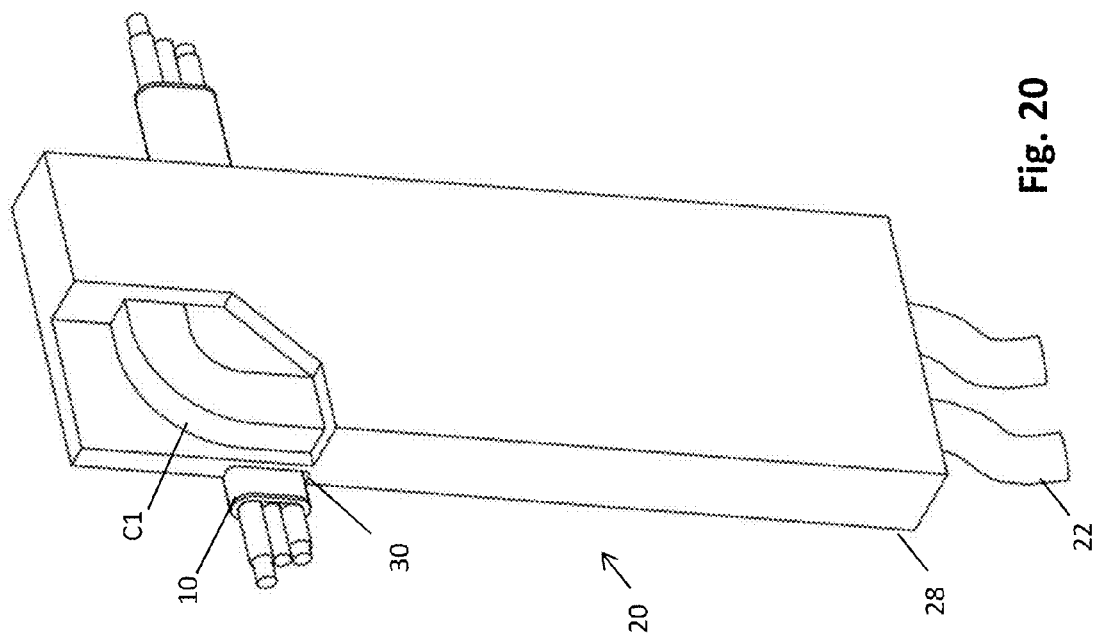

FIGS. 20-21 show two possible implementations of the One-Coil meter. FIG. 20 shows a probe 20 having connections 22 to be connected to inputs of a separate device, such as a digital multimeter (DMM), containing signal processing electronics and a display. In use the probe 20 is placed near the cable 10, and the voltage signal from the coil C1 is provided at the connections 22 for sensing by the separate device. It may be preferred that the probe 20 have no active electronic components, although it may contain passive components for noise filtering for example. FIG. 21 shows a complete current meter 24 having integrated electronics (not shown) and display 26. Both the probe 20 and meter 24 will have a housing 28 (such as the rectangular housing shown) having a groove 30 or similar feature to hold/align the cable 10 during use. The housing 28 supports the coil C1, the display 26 if present and any electronic circuitry mounted within. In one embodiment, the mounting/holding groove 30 can be molded into a standard digital multi-meter, DMM, bringing the cable 10 within 1 to 1.5 mm of the coil C1—a value of p of ~4 mm. The One-Coil meter has only one coil C1 and the output is about 15 mV per Amp of current through the cable 10. For a probe-based approach such as that of FIG. 20, the mV function of a DMM can be used to display the current in the cable 10 directly.

In the devices 20 and 24, the groove 30 positions the cable 10 with respect to the coil C1. In alternative embodiments the housing 28 may employ an alternative feature such as an open-jaw slot into which the cable 10 is pushed. A spring may be used to push the cable 10 towards the single coil C1 for best proximity (signal strength) as well as accuracy. Depending on the application, one arrangement (groove versus slot) may be preferred over the other. In another embodiment intended to be used with cables 10 of two different sizes, cable-engaging features may be located on opposite sides of a single coil C1, with each feature tailored for one of the cable types. The dimensions of the slot and groove may generally be such that a desired set of common cables 10 can be accommodated. With the range of cable dimensions being 10±2 mm (wide) and 5±1 mm (thick), the device can be calibrated at 10 mm and 5 mm and the maximum displacement will be 1 mm and 0.5 mm, respectively.

In one embodiment a One-Coil Meter may be used to locate and follow current-carrying cables 10 inside the walls of buildings. This can be accomplished with the meter being placed so that the coil C1 is flat against a wall. FIG. 15 shows, as a function of coil width, D, the output of a coil with the dimensions L=35 mm, b=5 mm, t=6 mm. The output is given for coil-to-cable separations in the range of 3 mm to 24 mm. For a distance of 4 mm the output of the meter is 15 mV per Ampere in the cable. This decreases to 5.3 mV per Ampere as the distance increases to 20 mm, a typical thickness for a drywall panel.

Figure 22:
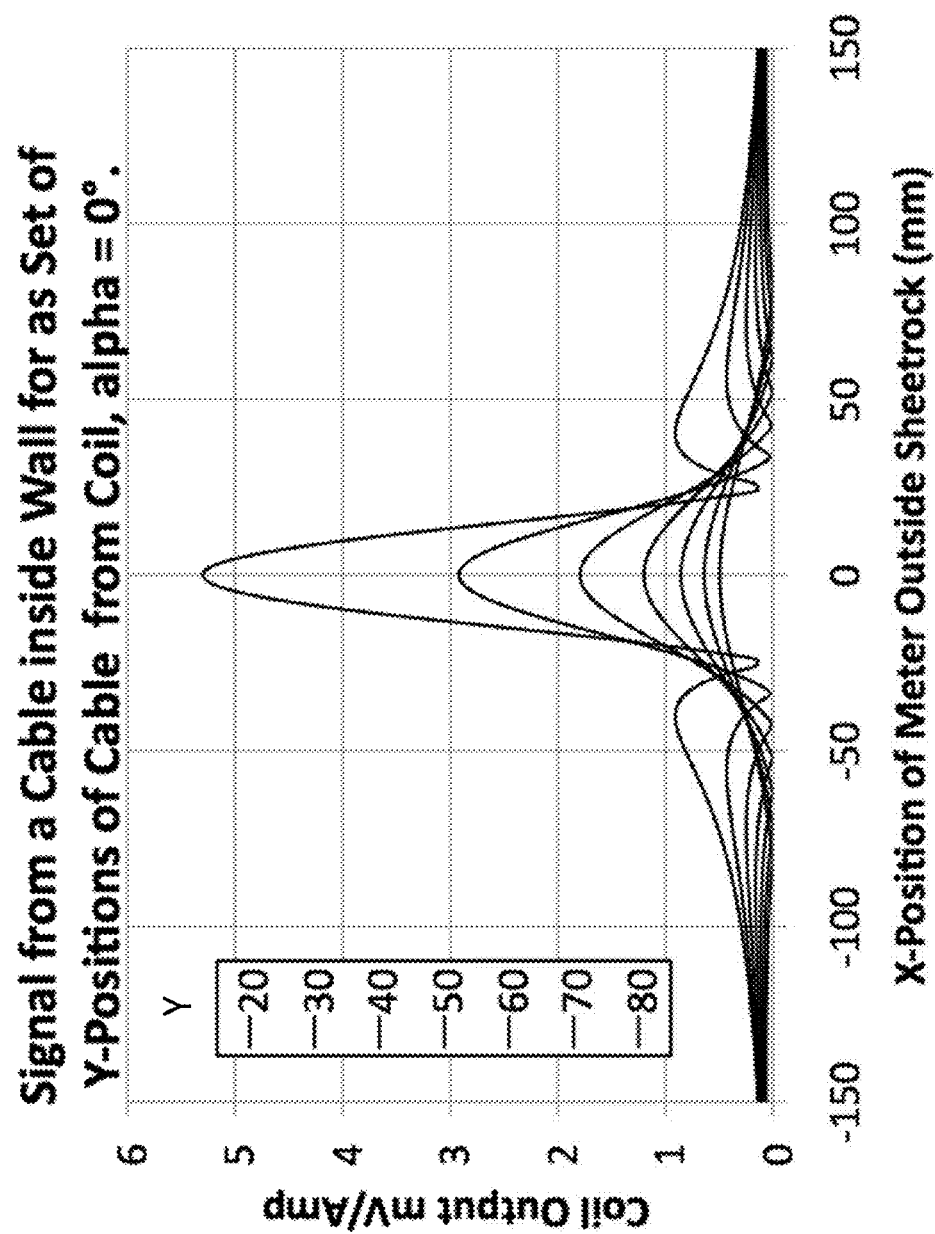
FIGS. 22-23 are plots of coil output versus position for a cable behind sheetrock.
Figure 23:
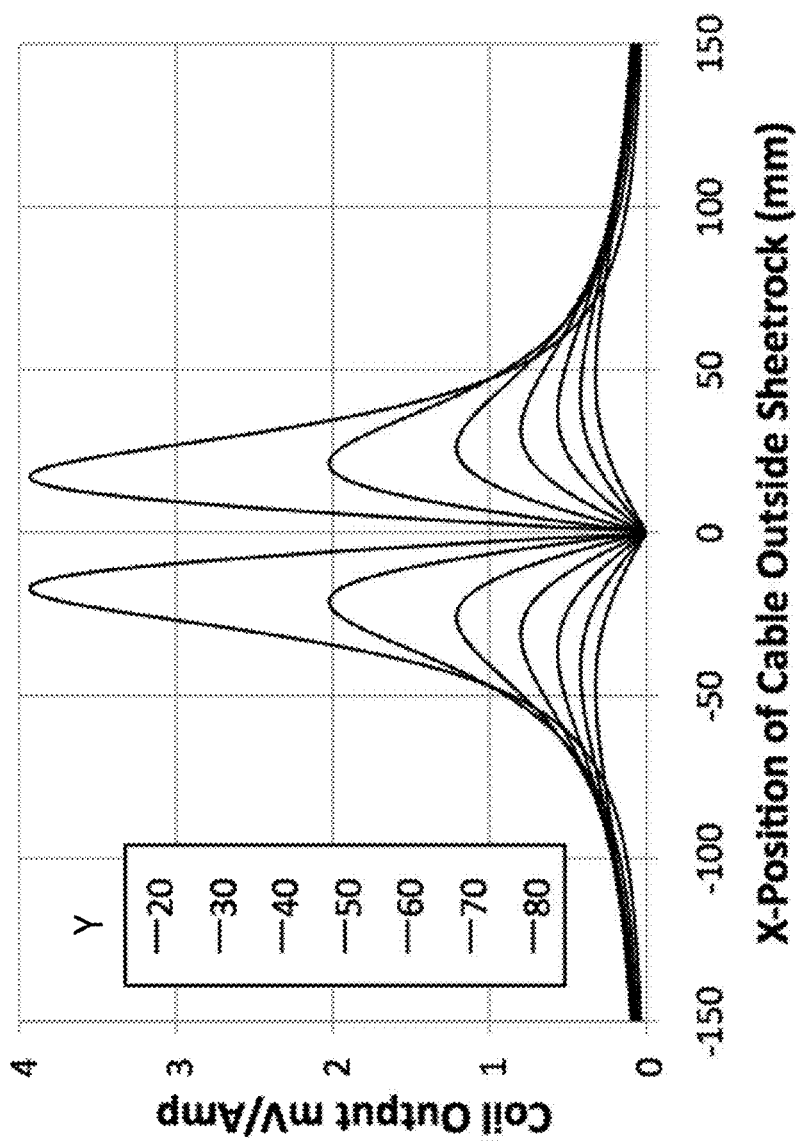

FIGS. 22 and 23 show the output of the meter for distances from 20 mm to 80 mm, corresponding to the possible locations of a cable inside a residential structure, i.e. a studded wall with drywall covering. FIG. 22 shows the changes in the signal as the meter is moved in X and Y across the wall perpendicular to the cable 10 where the two conductors 12 of the cable 10 are in a plane parallel to the plane of the coil C1. FIG. 23 shows the same with the cable plane perpendicular to the coil. For other cable rotations the signal gradually changes from a one-peak to a two-peak signal making it possible to note the rotation of the cable inside the wall.

The two-coil device shown in FIG. 2 (referred to herein as the Two-Y-Coil Meter), has the advantage that the cable 10 can be pushed into the slot of the device, so that the cable 10 does not have to be held by hand. The cable 10 is very close to both coils C1 and C2, and the voltages induced in the coils C1 and C2 are added together to result in a signal of about 30 mV for 1 Amp of current in the cable 10. The current in the cable 10 is directly proportional to the sum of RMS signals, S1 and S2, from the coils, C1 and C2, i.e. I=constant×(S1+S2). The ratio of the signals, R1=S1/S2, is constant for all wires and their possible currents. If a second cable in the vicinity produces an interference field, the value of R1 will change and thus serve as an indication of a potentially incorrect current reading.

Figure 24:
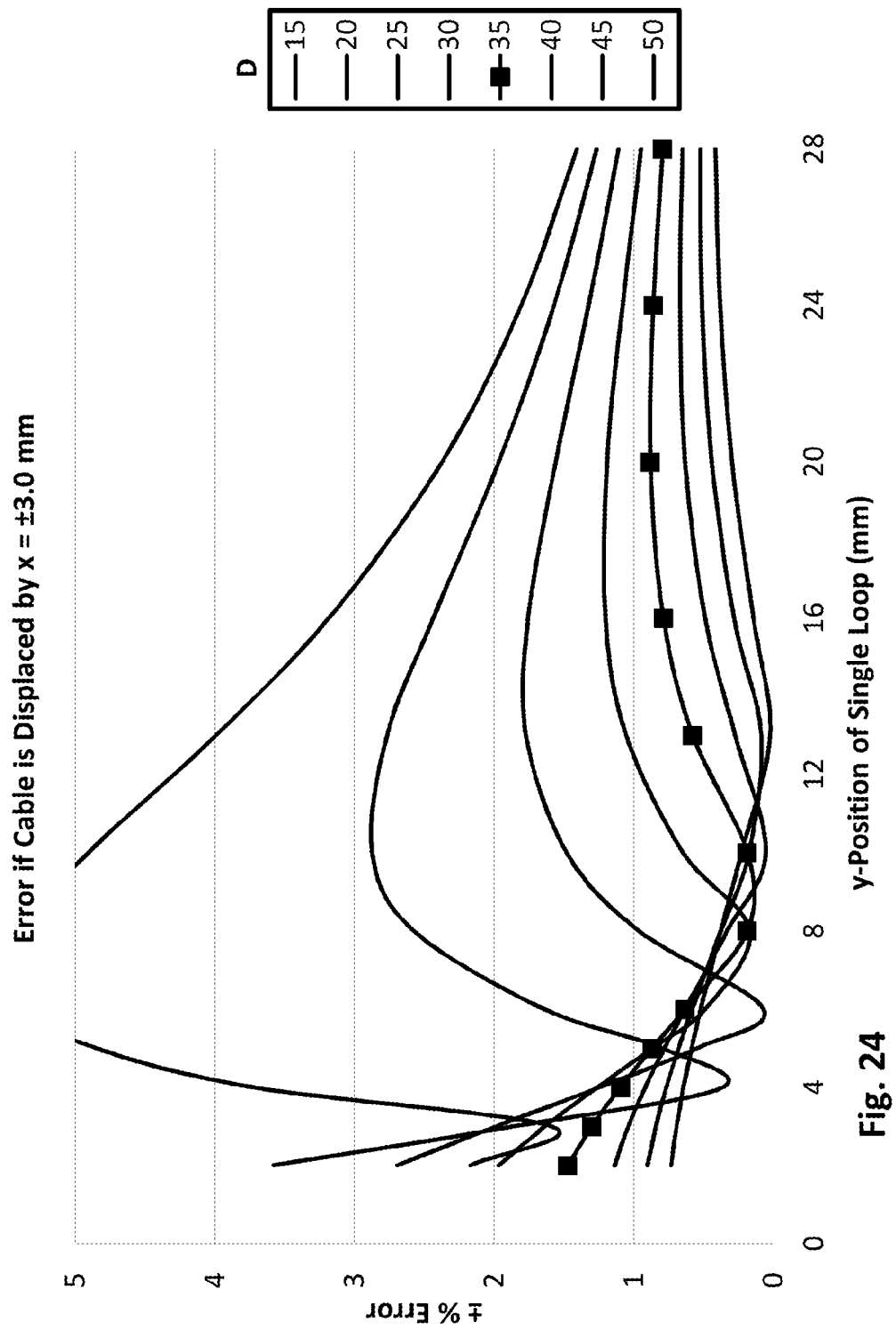
FIGS. 24-26 are plots of error in coil output versus displacement in cable position.

FIG. 24 shows the effect of diameter D and Y-position of two square, single-loop coils on the % error due to an X-displacement of ±3.0 mm. As shown, the error gets smaller as the loop becomes larger and is placed closer to the cable 10. Also shown are "sweet spots" for large-D coils where the error becomes essentially zero.

Figure 25:
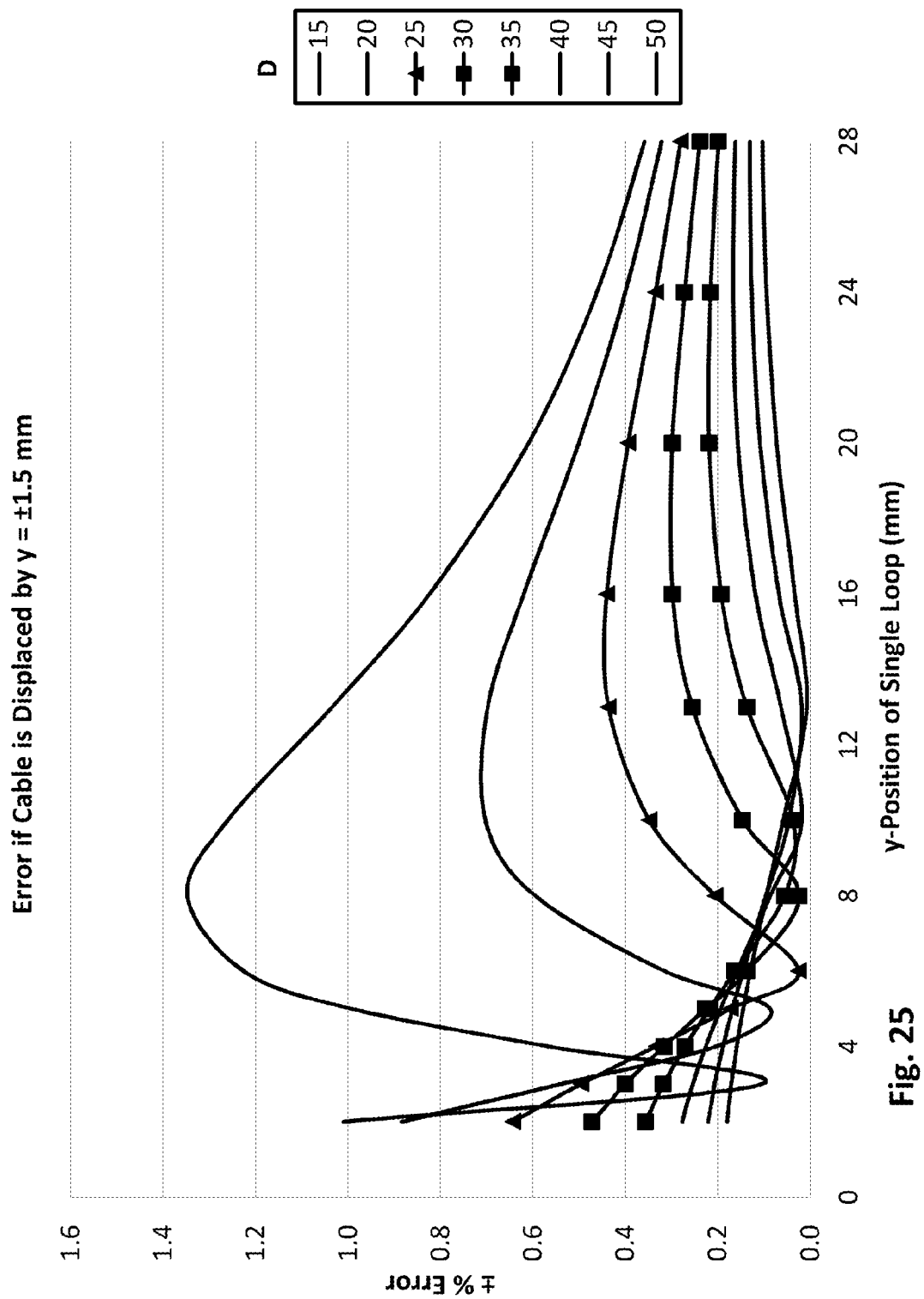

FIG. 25 shows the effect of diameter D and Y-position of two square, single-loop coils on the % error due to a Y-displacement of ±1.5 mm. As shown, the error gets smaller as the loop becomes larger and moves closer to the cable 10. Also shown are "sweet spots" for large-D coils where the error becomes essentially zero.

Figure 26:
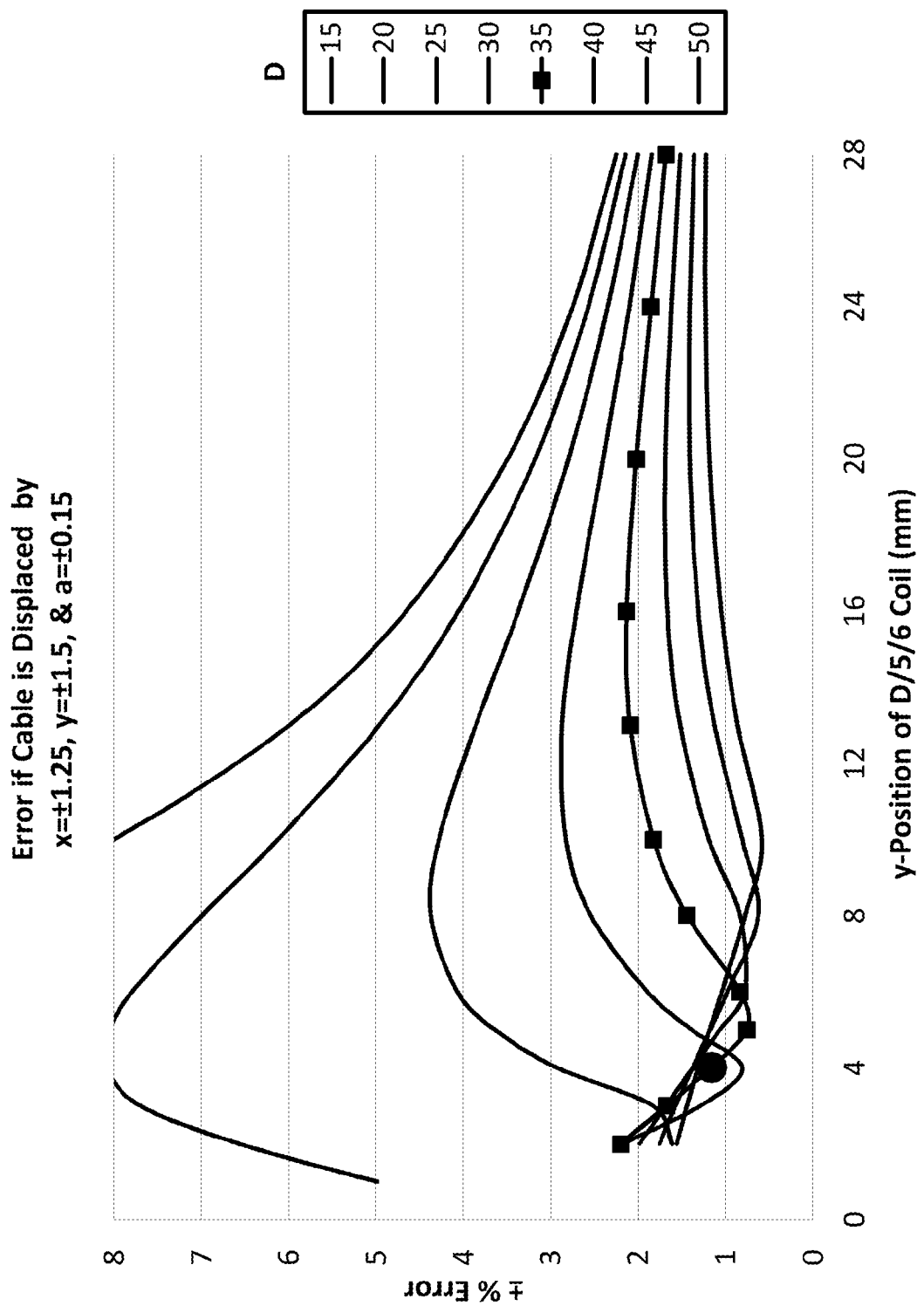

FIG. 26 shows the effect of diameter D and Y-position of two square, multi-loop coils of 6 mm thickness and 5 mm depth on the error due to an X-displacement of ±1.25 mm, a Y-displacement of ±1.5 mm, and a rotation of ±0.15 radians. As shown, the error gets smaller as the loop becomes larger and is placed closer to the cable 10. Also shown are "sweet spots" for large-D coils where the error becomes essentially zero. With y=4 mm being a practical limit of closeness and considering the cost and space needed for very large coils, the dimensions of D=35 mm, b=5 mm and t=6 mm provide a good compromise which will give an error of ±2%.

Figure 27:
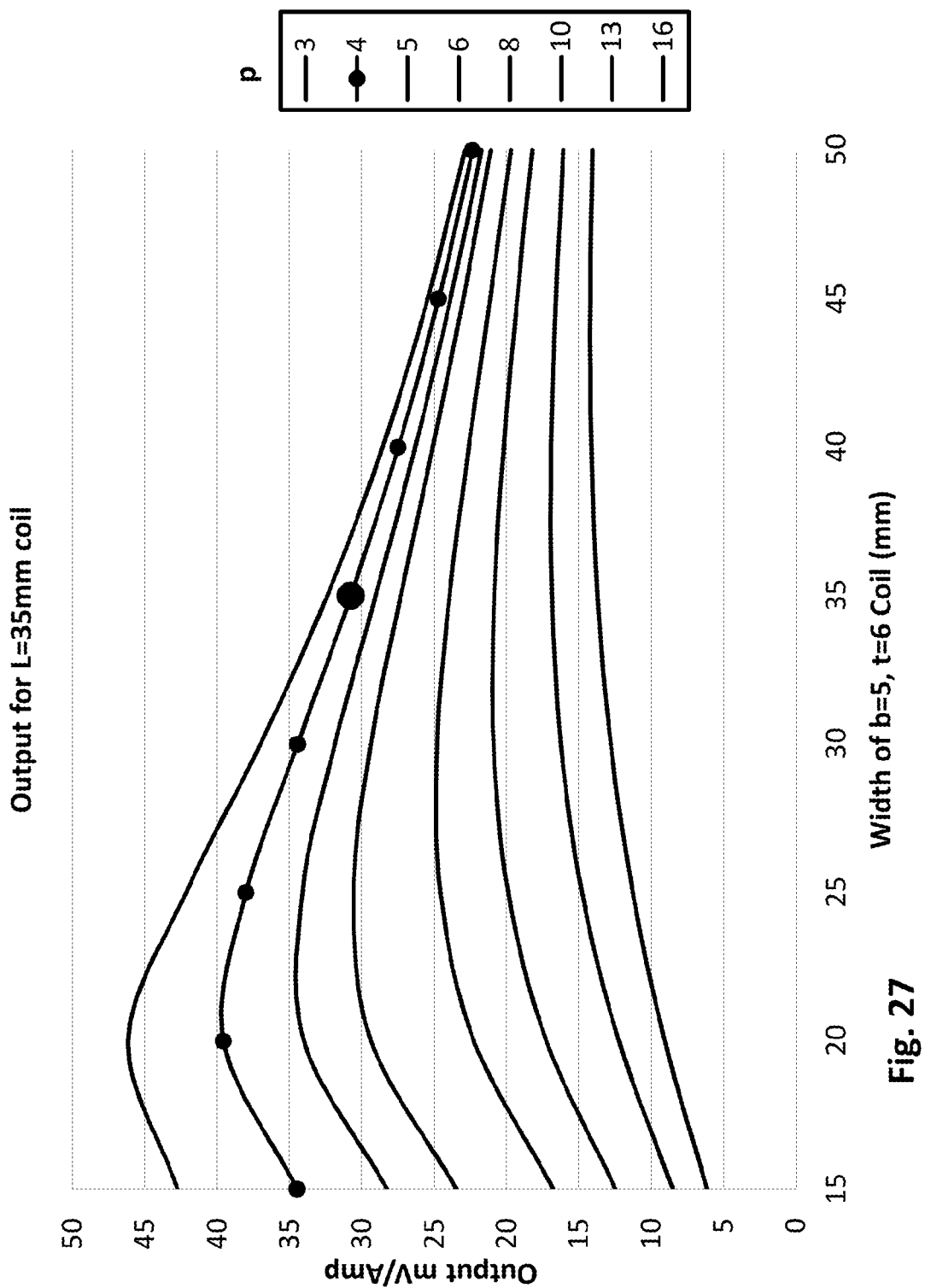
FIG. 27 is a plot of coil output versus coil proximity and coil width.
Figure 28:
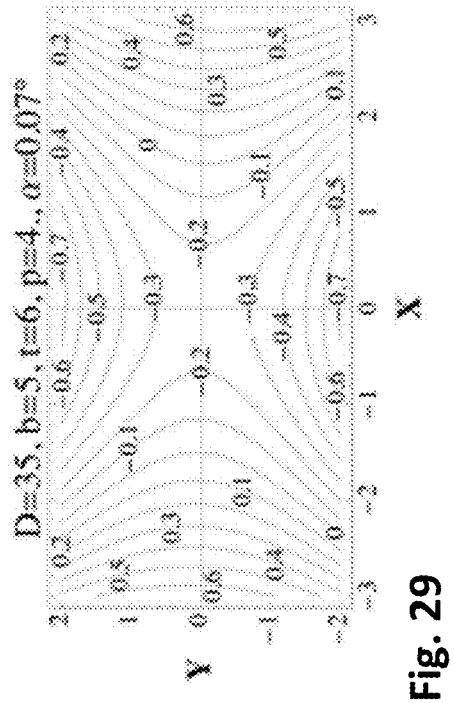
FIGS. 28-31 are plots of variation in coil output versus displacement in cable position.
Figure 30:
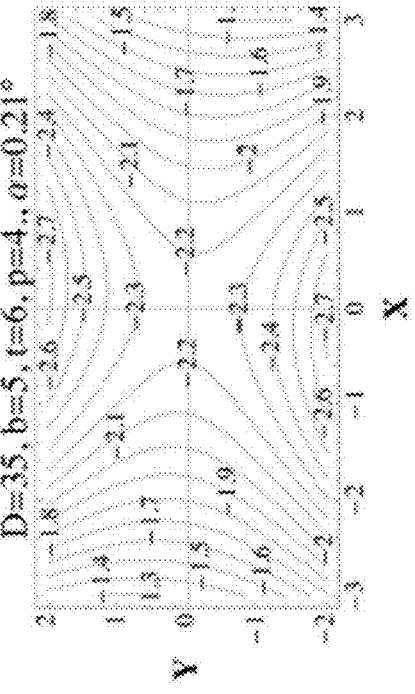
Figure 29:
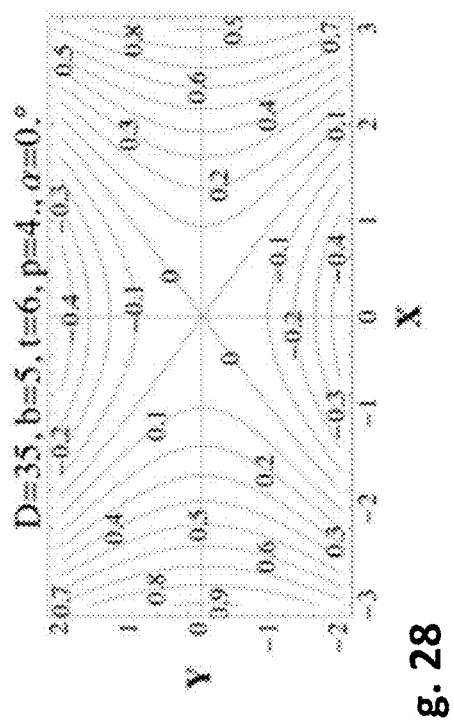
Figure 31:
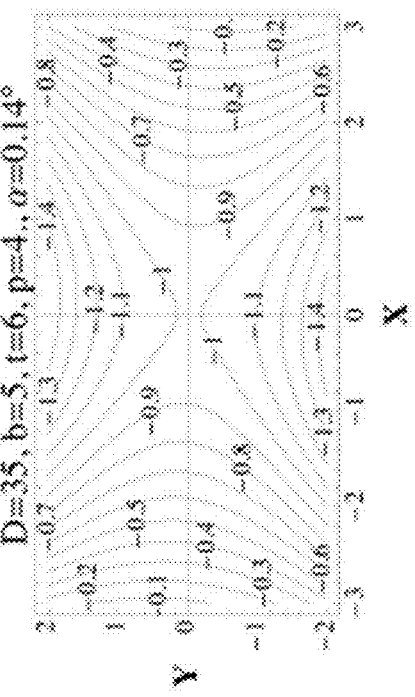

FIG. 27 shows output signal of rectangular, L×D coils, where L is the coil dimension along the cable and D is the dimension across the cable. The output, when the two coils are wired in series, is given per ampere of current in the cable 10 and is shown as a function of D for several p-positions of a multi-loop pair of coils of 6 mm thick and 5 mm deep. The signal is proportional to L, which equals 35 mm in this example. The signal increases with proximity to the cable 10, with p=4 mm being a practical limit of closeness. For each coil position, p, the maximum signal occurs at a different value of coil diameter, D, where this value increases as the coil moves away from the cable. As can be appreciated from FIG. 2, the flux through the coils C1 and C2 increases with D until the windings of the coil reach the point where the magnetic field lines become horizontal and any further increase in coils size will reduce the signal as the field has reversed direction. The maximum signal at p=4 mm is obtained at about D=20 mm, but considering the increase in error (FIG. 24-26), and the advantage of using square or round coils, the dimensions of D=35 mm, b=5 mm, and t=6 mm provide a good compromise, resulting in a signal of about 30 mV per Ampere in the cable 10.

FIGS. 28-31 shows, for the Two-Y-Coil configuration, the percentage change, i.e. error, in induced voltage if the cable 10 is displaced by ±3 mm in X and by ±2 mm in Y for angles of rotation of 0, 0.07, 0.14, 0.21 radians. The maximum error is less than 3% over this domain.

FIGS. 24-26 and 28-31 show the percentage variation of the signal if the cable 10 is moved in X and Y with different angles of rotation, α. The Two-Y-Coil meter is less sensitive to a Y-displacement than the One-Coil meter because the changes in flux through the two coils C1, C2 compensate for each other. This can be seen from the contours in FIG. 2. As it is easy to constrain the cable 10 horizontally to ±3.0 mm, vertically to ±1.5 mm and rotationally to ±0.15 radians, the error due to cable displacement is less than 2%, which is very small when compared to the error in variation of the separation of the two conductors, d, and voltage variation. FIG. 27 shows the signal output as a function of coil size and position, and the approach of using two 35 mm square coils placed 4 mm from the cable 10. FIGS. 28-31 show that a larger set of cable 10 cables, 10±2 mm (wide) and 5±1 mm (thick), can easily be accommodated and the error can still be kept under 3%. Other coil geometries and positions are possible.

FIGS. 32-33 show two possible implementations of the Two-Y-Coil meter. As for the One-Coil meter, there is a probe implementation 40 and a complete integrated meter implementation 42. The two coils C1, C2 are mounted one above the other inside the instrument. A gap 44 is created in the molding of the device so that the cable 10 can be inserted. The gap 44 is dimensioned such that an average cable 10 is centered in X and the width of the gap 44 is equal to the thickest cable 10 likely encountered.

The other two-coil device, shown in FIG. 3 and referred to herein as the Two-X-Coil meter, has the advantage over the Two-Y-Coil meter that the deep slot or gap 44 into the instrument is replaced by a simple groove like groove 30 of FIG. 20, and has the advantage over the One-Coil meter in that the two coils C1 and C2 make the signal less sensitive to the misplacement of the cable 10. The cable 10 is placed between the two coils C1, C2 and the voltages induced in the two coils are directly proportional to the current in the cable 10, i.e. I=constant×(S1+S2). The ratio of the signals, R1=S1/S2 is constant for all wires and their possible currents. If a second cable produces an interference field this ratio will change and can be used to indicate a potentially incorrect current reading.

Figure 34:
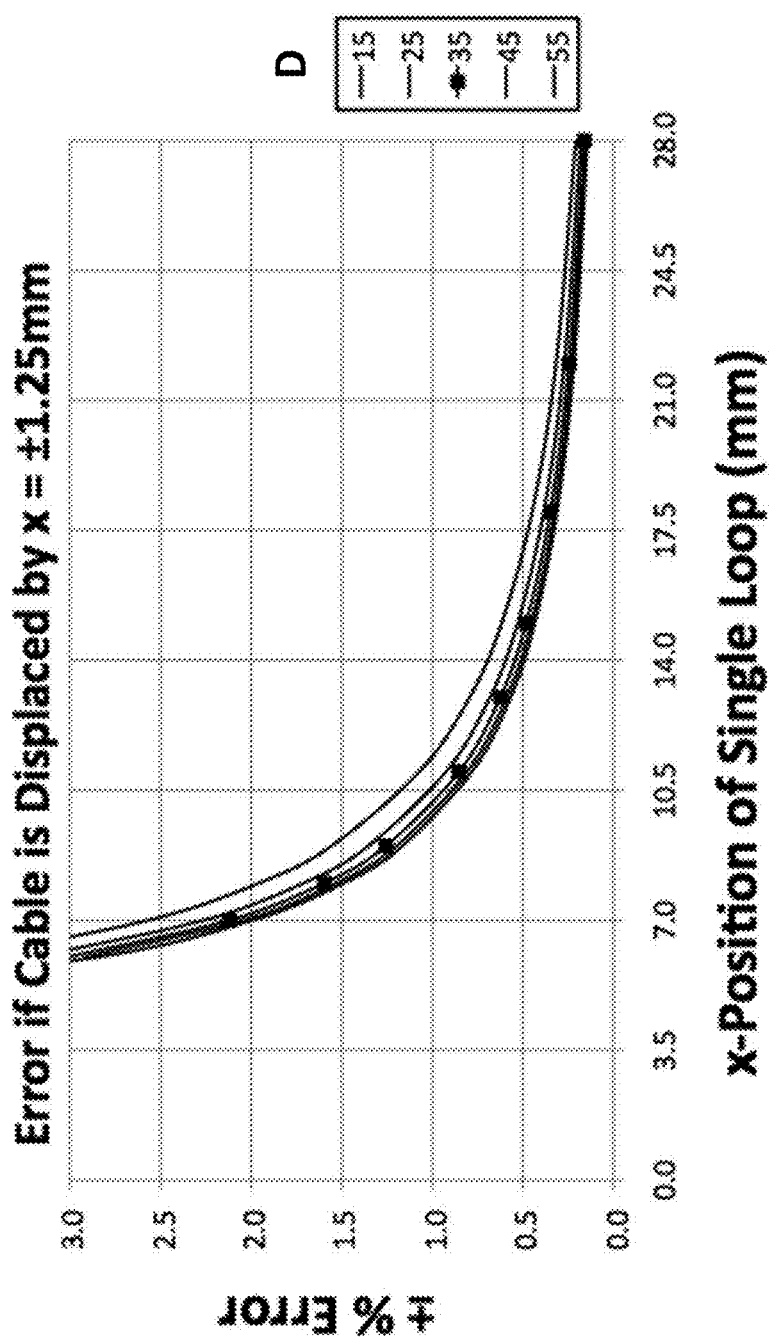
FIGS. 34-36 are plots of error in coil output versus displacement in cable position.

FIG. 34 shows the effect, for the Two-X-Coil meter, of diameter D and Y-position of two, square, single-loop coils on the % error due to an X-displacement of ±1.25 mm. As shown, the error gets smaller as the loops are placed closer to the cable 10. There is little dependence on the size of the loops.

Figure 35:
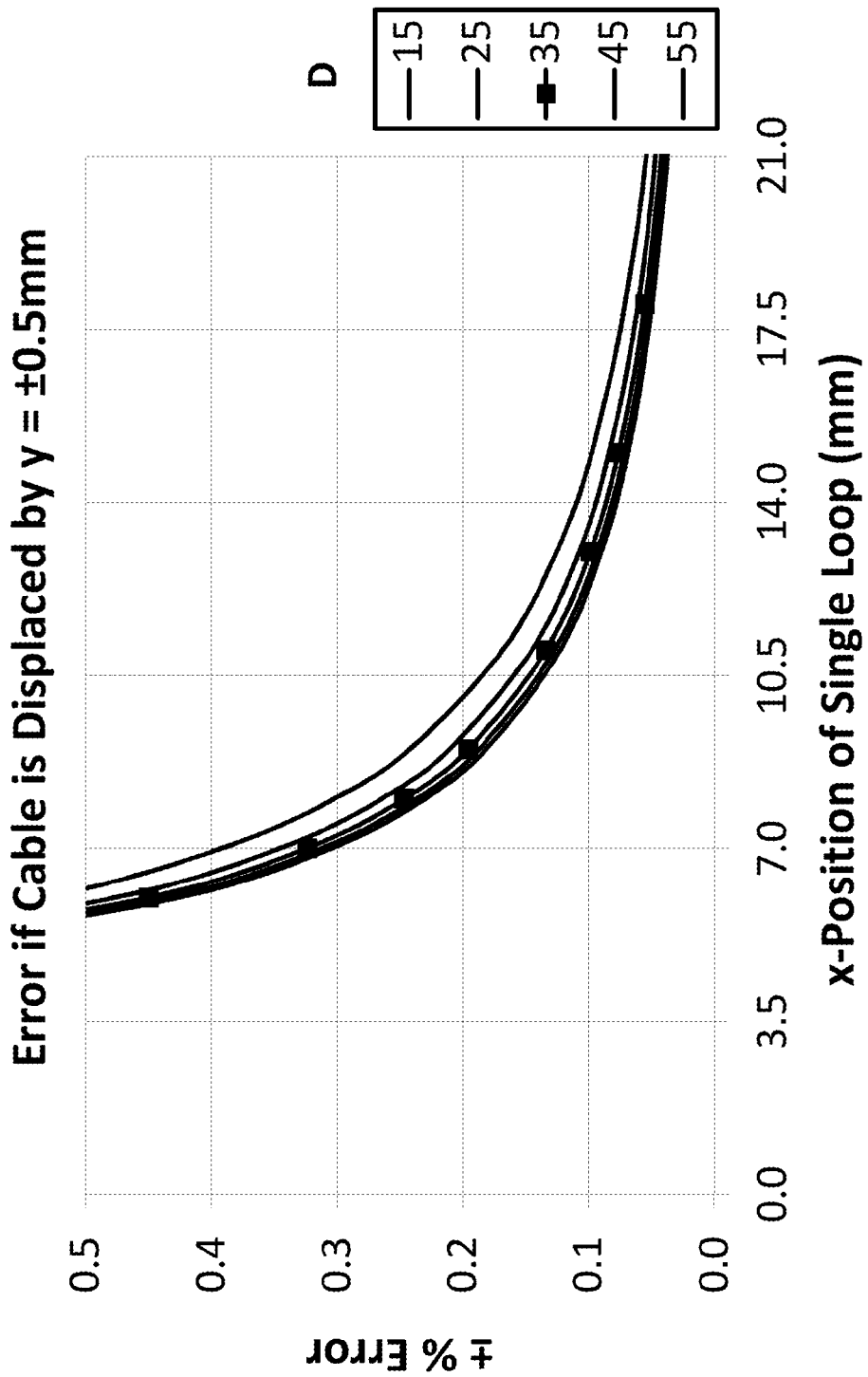

FIG. 35 shows the effect of diameter D and Y-position of two, square, single-loop coils on the reading error due to a Y-displacement of ±0.5 mm. As shown, the error gets smaller as the loops are placed closer to the cable 10. There is little dependence on the size of the loops.

Figure 36:
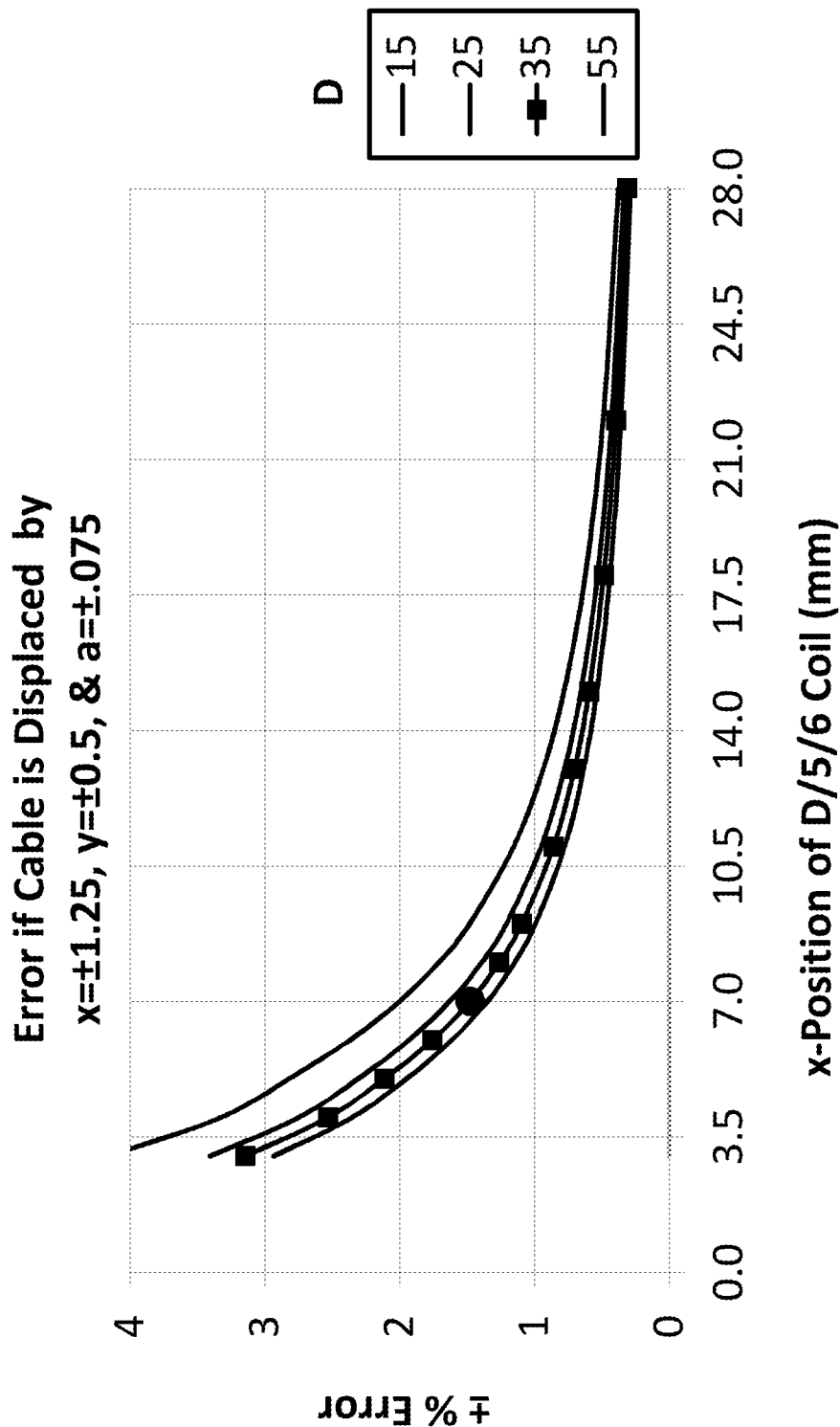

FIG. 36 shows the effect of diameter D and Y-position of two square, multi-looped coils on the error due to a cable 10 X-displacement of ±1.25 mm, a Y-displacement of ±0.5 mm, and a rotation of ±0.075 radians. As shown, the error gets smaller as the loops are placed closer to the cable 10, but here is little dependence on the size of the loops. With x=7 mm being a practical limit of closeness and considering the cost and space needed for very large coils, the dimensions of D=35 mm, b=5 mm, and t=6 mm may provide a good compromise which will give an error of ±1.5%. This error is significantly smaller than the 2.6% for the smaller Y-displacement of 0.4 mm and rotation of 0.05 radians of the One-Coil meter.

Figure 37:
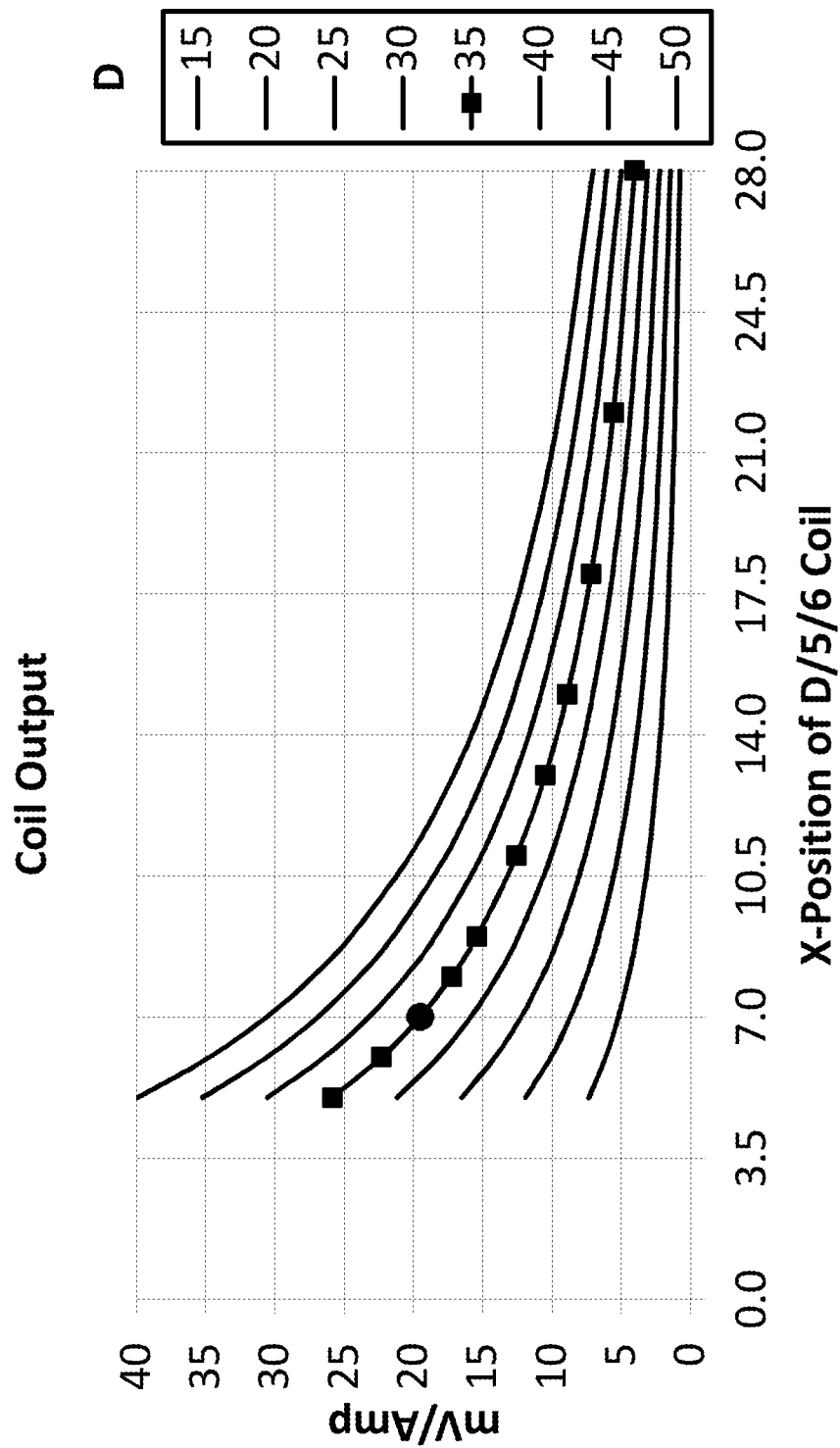
FIG. 37 is a plot of coil output versus coil proximity and coil width.
Figure 38:
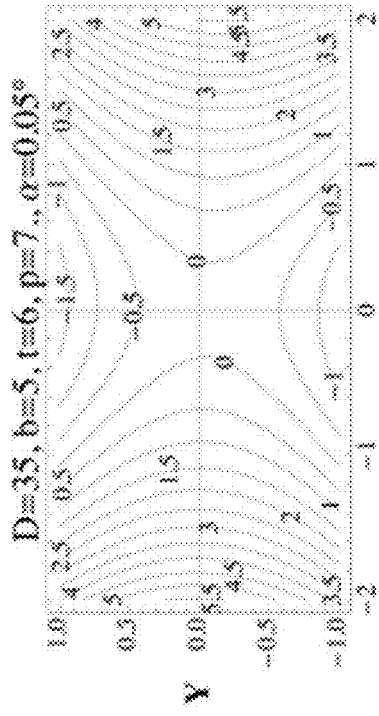
FIGS. 38-41 are plots of variation in coil output versus displacement in cable position.
Figure 39:
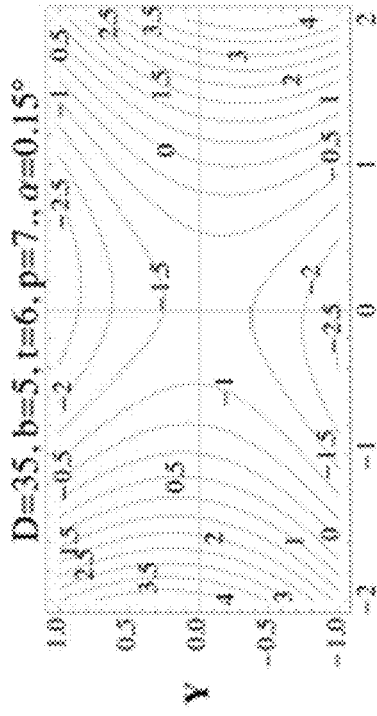
Figure 40:
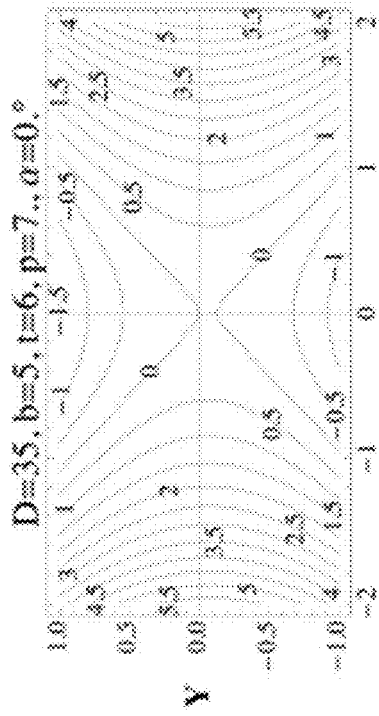
Figure 41:
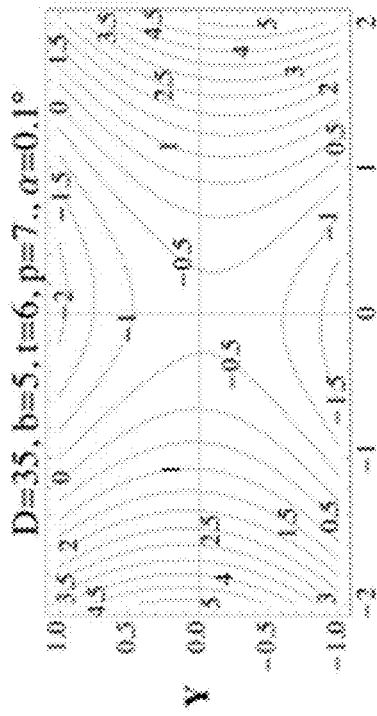

FIG. 37 shows the effect of diameter D and Y-position of a square, multi-loop coil of 6 mm thickness and 5 mm depth on the output per ampere of current in the cable 10. The signal increases with coil size and proximity to the cable 10. With p=7 mm being a practical limit of closeness and considering the cost and space needed for very large coils, the dimensions of D=35 mm, b=5 mm, and t=6 mm may provide a good compromise which will give a signal of 19 mV/Amp.

FIGS. 38-41 show the percentage change, i.e., error, in induced voltage if the cable 10 is displaced in X by ±2 mm and in Y by ±1 mm for the angle of rotations of 0, 0.05, 0.1, 0.15 radian. The maximum error is less than 3% over this domain.

FIGS. 34-36 and 38-41 show the percentage variation of the signal if the cable 10 is moved in X and Y with different rotation angles, α. The Two-X-Coil arrangement is less sensitive to a Y-displacement than the One-Coil arrangement, because the changes in flux through the two coils C1, C2 compensate for each other. This can be seen from the contours in FIG. 3. As it is easy to constrain the cable 10 horizontally to ±2 mm, vertically to ±1 mm and rotationally to ±0.1 radians (i.e., ±6°), the error due to cable displacement is less than 3%, which is very small when compared to the error in variation of the separation of the two conductors, d. FIG. 37 shows the signal output as a function of coil diameter and position, and the use of two 35 mm square coils placed p=7 mm from the cable 10. FIGS. 38-41 show that a larger set of cables 10, 10±2 mm (wide) and 5±1 mm (thick), can easily be accommodated and the error can still be kept under 5%. Other coil geometries and positions may be used.

The Two-X-Coil meter may be implemented in a manner similar to that shown in FIGS. 20 and 21, except that the two coils C1 and C2 are mounted in the same plane as the cable 10 and on opposite sides thereof as shown in FIG. 3.

For all three variations of a current meter described herein, the signal is proportional to the separation, d, of the two conductors 12. This is a disadvantage of all meters using the magnetic field pattern around two or three-conductor cables. At a distance of more than two times the wire separation d from the cable 10, the field strength is approximately proportional to d, so placing additional sensors around the cable 10 will not make it possible to measure the current independent of d. The wire separation, d, is (either implicitly or explicitly) known to the instrument.

The above-described configurations assume that the field being measured is generated only by the two conductors 12 of the subject cable 10. This assumption may not be valid if there are other cables in sufficiently close proximity, which is often the case in real installations. A second, parasitic, current-carrying cable 10 (referred to as "PR") in the vicinity of the cable 10 being measured can change the signal and cause a faulty reading. To avoid this error when using the One-Coil meter, it may be necessary to move and/or rotate the PR or move the device with the cable. A multiple-coil meter may be able to perform an additional calculation to check for interference. As mentioned above, the ratio R=S1/S2=1 if the cable 10 is centered. The presence of a PR can change this ratio, and the detection of such a change can be used to warn the user. It is noted that a PR equidistance from the two coils C1 and C2 will affect S1+S2 but not S1/S2, so no interference is detected in that case. A similar situation can occur for other positions if the PR is rotated. The likelihood of faulty readings due to PRs can be much reduced by adding interference coils to any of the three instruments.

Figure 42:
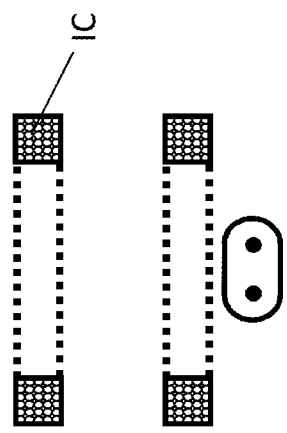
FIGS. 42-44 are schematic diagrams illustrating coil placement adjacent to a current carrying, multiple-conductor cable.
Figure 43:
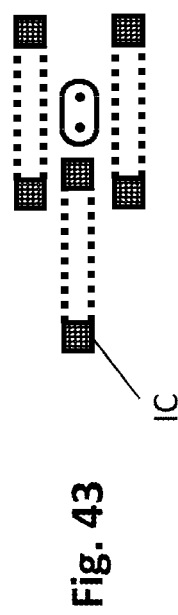
Figure 44:
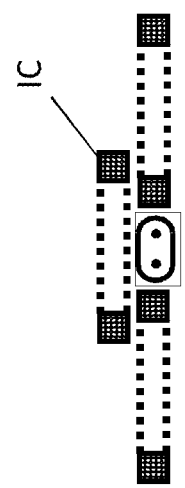

FIGS. 42-44 show possible implementations in which interference coils IC are added to the instruments. FIG. 42 shows the IC mounted above the sensing coil C1 of the One-Coil meter. FIG. 43 shows a third coil, the IC, mounted to the side of the cable 10 between the two sensing coils C1, C2 of the Two-Y-Coil meter. FIG. 44 shows a third coil, IC, mounted on top of the cable 10 and centered between the two sensing coils C1, C2 of the Two-X-Coil meter. The third coil, IC, added to the two two-coil meters (Two-Y-Coil and Two-X-Coil) may be very effective in detecting PRs, as this permits three ratios to be monitored, namely S1/S3, S2/S3, and S1/S2. Further, the flux through the two sensing coils S1, S2 and through the IC is of opposite sign. Therefore the flux due to a PR, which will likely be in the same direction over the region of the three coils, affects the SCs and IC in different directions, causing a large change in S1/S3 and S2/S3.

Figure 45:
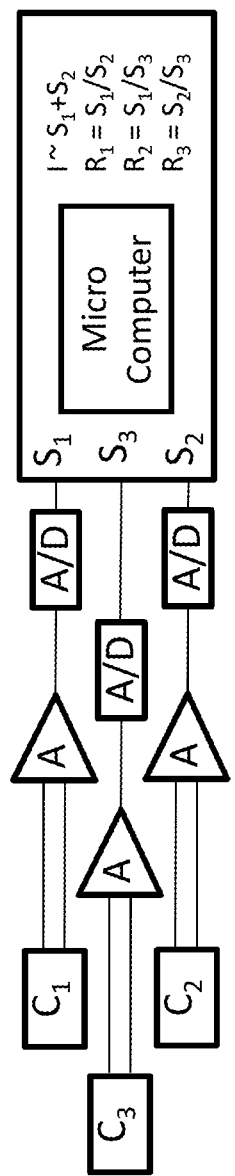
FIG. 45 is a schematic diagram of electronic circuitry of a current meter.

FIG. 45 shows electronic circuitry constituting a read-out system for a three-coil configuration such as that of FIGS. 43 and 44. The circuitry may be similar to that shown in FIGS. 4-5, with potentially multiple ratios S1/S2, S2/S3 and S1/S3 being calculated and used for interference detection.

The meters disclosed herein may be used for current sensing in other types of electrical cables such as lamp cords and round cables. In the case of the One-Coil and Two-X-Coil meters, a second, smaller and deeper, groove may be used to locate the lamp cord, and in the case of the Two-Y-Coil meter the lamp cord could be positioned approximately at the center of the gap 44. In both cases the wire separation must be known. A selector switch may be used to switch between use with lamp cords and other cables such as NM.

Measuring the current in a round cable is complicated by the constantly changing cross-sectional relationship of the twisted-together conductors 12. One general approach is for the meter to be capable of latching a maximum reading occurring over a short period of time (e.g., several seconds) and to move the meter relative to the cable (or vice versa) to ensure movement through the maximum-flux position of FIGS. 1-3. For example, the meter may be rotated by at least 90° around the cable axis to find the maximum reading. Alternatively, the meter can be moved along the cable over at least one period of twisting, which may be several centimeters for example. If the conductor separation is known, then the current will also be known with the same accuracy, providing the twist is long compared to the dimension(s) of the coil(s). For at least some round cables, it may be prudent to use the meter to indicate presence of current rather than to measure a magnitude of the current.

In one embodiment, the AC current measurement can be combined with a voltage indicator by using known electrostatic voltage probe(s) which check for the presence of AC voltage. The sensors might most conveniently be located in the center of the coil(s). By this arrangement, the meter can alert the user (by means of a flashing LED or otherwise) that the conductors are carrying a non-zero voltage, even when no current is present. This mechanism can help protect a user from taking unsafe actions on a false presumption that a zero-current indication implies that the cable is not "live".

In another embodiment, the frequency of the AC signal can be measured. Because the voltage signal induced in the coil(s) is proportional to the frequency, the instrument may compute the current using the measured frequency.

The following summarizes certain important aspects of a current meter as disclosed herein.

1) The use of only one or two pick-up coils, to measure the magnetic flux and hence the electric AC current in a two-conductor cable, where each coil has a large number of turns and is optimally dimensioned and positioned to
   a) Obtain a high, low-noise induced AC voltage,
   b) Eliminate the needs of clamps or other moving parts to hold the cable in the device,
   c) Obtain an accurate measurement of the electric AC-current in the cable without exact positioning of the cable,
   resulting in a compact, inexpensive, with unmovable components, hand-held probe designed to measure the current in two-conductor cable 10 cables, lamp-cords and round power cables.
2) A design, One-Coil, which uses a large single pick-up coil to measure the electric AC current in a cable directly from the signal of this single coil, where the signal is independent of small displacements of the cable.
3) Where the One-Coil device can be either
3.1) a probe consisting only of one coil with a passive RC filter used in conjunction with an external millivolt AC meter or a multimeter with a mV AC function, or by adding a rectifier to the coil output in conjunction with a DC mV meter or other modes of readout or
3.2) a stand-alone meter where the coil is placed adjacent a bottom groove, or a slot, or at the front, of a digital or analog meter and the cable is positioned right against this coil.
4) A design, Two-Y-Coil, which uses two pick-up coils, each with a large number of turns, dimensioned and positioned with respect to a two-conductor cable such as to measure the electric AC current in the cable directly from the sum of the two coils, and where the signal is independent of small displacements of the cable.
5) The Two-Y-Coil meter can be either
5.1) a probe consisting only of two coils with passive RC filters, used in conjunction with an external millivolt AC meter or a multi-meter with a mV AC function, or by adding a rectifier to the coil output in conjunction with a DC mV meter or other modes of readout or
5.2) a stand-alone meter, where the coils may be imbedded inside a DMM and the cable positioned between the two coils using a slot in the device.
6) A design, Two-X-Coil, which uses two pick-up coils, each with a large number of turns, dimensioned and positioned with respect to a two-conductor cable such as to measure the electric AC current in the cable directly from the sum of the two coils, where the signal is independent of small displacements of the cable.
7) The Two-X-Coil meter can be either
7.1) a probe consisting only of two coils with passive RC filters, used in conjunction with an external millivolt AC meter, or with a multi-meter with a mV AC function, or by adding a rectifier to the coil output in conjunction with a DC mV meter or
7.2) a stand-alone meter, where the coils may be imbedded inside a DMM and the cable is positioned between the two coils using a slot in the device.
8) Using the ratio of the signals from the two coils of Two-Y-Coil and Two-X-Coil to detect the presence of signal-interfering magnetic fields from parasitic cable
9) A design where an additional coil is used in the any of the One-Coil, Two-X-Coil and Two-Y-Coil instruments to detect the presence of interfering magnetic fields due to the current in other cable(s). The signal from the additional coil is used to warn the user of a potential incorrect reading.

10) A design where an additional electric-field probe indicates the presence of voltage in the cable.

11) Using signal processing, the meter can also be a frequency probe.

While various embodiments of the invention have been particularly shown and described, it will be understood by those skilled in the art that various changes in form and details may be made therein without departing from the spirit and scope of the invention as defined by the appended claims.

What is claimed is:

1. Apparatus for use in measuring alternating current in a multiple-conductor cable having supply and return conductors spaced apart by a nominal conductor spacing and carrying respective supply and return currents in opposite directions, comprising:
   a non-magnetic body having a cable-engaging portion defining a location and an orientation axis of the multiple-conductor cable relative to the apparatus when the cable-engaging portion engages the cable during use;
   a planar, multi-turn wire coil supported by the body immediately adjacent to the location and lying in a plane parallel to the orientation axis, the wire coil having a coil diameter at least four times the nominal conductor spacing; and
   signal conditioning circuitry operative in response to a voltage signal developed across output ends of the wire coil to generate a conditioned voltage signal having a voltage magnitude determined by and indicative of a magnitude of the supply current during use.

2. Apparatus according to claim 1, wherein the coil is disposed symmetrically astride the cable.

3. Apparatus according to claim 2, wherein the nominal conductor spacing is in a range of 4 to 10 millimeters and the coil has a diameter in the range of 15 to 150 millimeters.

4. Apparatus according to claim 1, wherein coil includes 44 AWG wire.

5. Apparatus according to claim 1, wherein the coil has more than 1,000 turns.

6. Apparatus according to claim 1, wherein the cable-engaging portion includes an outer surface of the body having a groove in which the cable is placed in use.

7. Apparatus according to claim 1, wherein the cable-engaging portion includes opposing jaw-like members defining a slot in which the cable is placed in use.

8. Apparatus according to claim 1, wherein the cable-engaging portion has a generally flat shape extending in the plane parallel to the orientation axis to enclose the coil.

9. Apparatus according to claim 1, wherein the cable is a first cable and the apparatus is further usable for measuring current in a second multiple-conductor cable having a size different from the first cable, and the cable-engaging portion includes first and second sides of the body on opposite sides of the coil, the first side having a first groove in which the first cable is placed in use, and the second side having a second groove in which the second cable is placed in use.

10. Apparatus according to claim 1, wherein the cable is a first cable and the apparatus is further usable for measuring current in a second multiple-conductor cable having a size different from the first cable, and the cable-engaging portion includes opposing jaw-like members defining a slot on a first side of the coil in which the first cable is placed in use, the body further including a groove on a second side of the coil in which the second cable is placed in use.

11. Apparatus according to claim 1, wherein the coil is a first coil and the plane is a first plane, and further including a second planar, multi-turn wire coil supported by the body immediately adjacent to the location, the second coil lying in a second plane parallel to the orientation axis and having a second coil diameter equal to the diameter of the first coil.

12. Apparatus according to claim 11, wherein both the first coil and the second coil are disposed symmetrically astride the cable and the first plane is not coplanar with the second plane.

13. Apparatus according to claim 12, wherein the first and second coil are disposed on opposite sides of the cable in use.

14. Apparatus according to claim 13, wherein the cable-engaging portion of the body has an open-jaw configuration defining a slot into which the cable is placed during use, the slot located between the first and second coils.

15. Apparatus according to claim 11, wherein both the first coil and the second coil are disposed symmetrically about the cable and the first plane is coplanar with the second plane.

16. Apparatus according to claim 15, wherein the cable-engaging portion includes an outer surface of the body having a groove in which the cable is placed in use, the groove located between the first and second coils.

17. Apparatus according to claim 11, wherein the first and second coils generate respective first and second output signals additively combined to produce a combined voltage signal indicative of the magnitude of the supply current in the cable.

18. Apparatus according to claim 17, further including a third coil used for detecting interference caused by current in an adjacent interfering cable, the third coil generating a third output signal ratiometrically combined with at least one of the first and second output signals to produce an interference indication.

19. Apparatus according to claim 17, wherein the first and second output signals are ratiometrically combined to produce an indication of interference caused by current in an adjacent interfering cable.

20. Apparatus according to claim 1 forming a probe for use with a separate device housing separate electronic circuitry and a user display, wherein the body carries external electrical connections providing for interconnection between the probe and the separate device.

21. Apparatus according to claim 20, wherein the signal conditioning circuitry includes passive components configured as a noise filter and/or rectifier.

22. Apparatus according to claim 1 forming a standalone user-readable meter, the apparatus further including electronic circuitry operative to convert the voltage signal to a display-driving signal, and a user display receiving the display-driving signal and providing a corresponding user-readable indication.

23. Apparatus according to claim 1, further including electrostatic probes and associated circuitry for generating an indication of a non-zero voltage on the conductors.

24. Apparatus according to claim 1, further including frequency-measuring circuitry operative to generate an indication of frequency of the currents in the conductors.

* * * * *